US012640171B2

(12) United States Patent (10) Patent No.: US 12,640,171 B2
Sakakibara et al. (45) Date of Patent: May 26, 2026

(54) BURIED SOURCE LINE STRUCTURE FOR BOOSTING READ SCHEME

(71) Applicant: Sandisk Technologies, Inc., Milpitas, CA (US)

(72) Inventors: Kiyohiko Sakakibara, Mie (JP); Ken Oowada, Fujisawa (JP)

(73) Assignee: Sandisk Technologies, Inc., Milpitas, CA (US)

( * ) Notice: Subject to any disclaimer, the term of this patent is extended or adjusted under 35 U.S.C. 154(b) by 1002 days.

(21) Appl. No.: 17/731,583

(22) Filed: Apr. 28, 2022

(65) Prior Publication Data

US 2022/0254382 A1 Aug. 11, 2022

Related U.S. Application Data

(62) Division of application No. 16/666,077, filed on Oct. 28, 2019, now Pat. No. 11,342,006.

(51) Int. Cl.
*G11C 5/06* (2006.01)
*G11C 16/08* (2006.01)
(Continued)

(52) U.S. Cl.
CPC .............. *G11C 5/063* (2013.01); *G11C 16/08* (2013.01); *G11C 16/10* (2013.01); *G11C 16/24* (2013.01); *G11C 16/26* (2013.01); *G11C 16/3459* (2013.01); *H10B 41/27* (2023.02); *H10B 41/35* (2023.02); *H10B 43/27* (2023.02); *H10B 43/35* (2023.02); *H10D 84/0128* (2025.01);
(Continued)

(58) Field of Classification Search
CPC ........ H10B 43/27; H10B 43/35; H10B 41/27; H10B 41/35; H10D 84/016; H10D 84/0128; H10D 84/8311; H10D 84/837
See application file for complete search history.

(56) References Cited

U.S. PATENT DOCUMENTS 9,019,767 B2 * 4/2015 Aritome ............. G11C 16/0408
365/174
2013/0234233 A1 9/2013 Fujiwara et al.
(Continued)

FOREIGN PATENT DOCUMENTS

KR 1020130057670 6/2013

OTHER PUBLICATIONS

Richard C. Jaeger, Volume V Introduction to Microelectronic Fabrication, 1993, Addison-Wesley Publishing Company, p. 79. (Year: 1993).*
(Continued)

*Primary Examiner* — Marcos D. Pizarro
(74) *Attorney, Agent, or Firm* — PEARL COHEN ZEDEK LATZER BARATZ LLP

(57) ABSTRACT
A non-volatile memory device is provided that includes an alternating stack of conducting layers and dielectric layers, a charge trap layer, a layer of polysilicon, and a tunneling dielectric layer arranged between the charge trap layer and the layer of polysilicon. The charge trap layer extends through the alternating stack of conducting layers and dielectric layers. The layer of polysilicon includes a first portion having a first thickness and a second portion having a second thickness that is greater than the first thickness. The second portion is arranged below the alternating stack of conducting layers and dielectric layers.

10 Claims, 24 Drawing Sheets

(51) Int. Cl.

| | |
|---|---|
| *G11C 16/10* | (2006.01) |
| *G11C 16/24* | (2006.01) |
| *G11C 16/26* | (2006.01) |
| *G11C 16/34* | (2006.01) |
| *H10B 41/27* | (2023.01) |
| *H10B 41/35* | (2023.01) |
| *H10B 43/27* | (2023.01) |
| *H10B 43/35* | (2023.01) |
| *H10D 84/01* | (2026.01) |
| *H10D 84/03* | (2025.01) |
| *H10D 84/83* | (2025.01) |

(52) U.S. Cl.
CPC ......... *H10D 84/016* (2025.01); *H10D 84/038* (2025.01); *H10D 84/8311* (2025.01); *H10D 84/837* (2025.01)

(56) References Cited

U.S. PATENT DOCUMENTS

| | | |
|---|---|---|
| 2013/0272069 A1 | 10/2013 | Rabkin et al. |
| 2016/0211023 A1* | 7/2016 | Zhang ................ G11C 16/0483 |
| 2016/0276365 A1 | 9/2016 | Choi et al. |
| 2017/0110464 A1 | 4/2017 | Rabkin et al. |
| 2018/0122907 A1 | 5/2018 | Choi et al. |

OTHER PUBLICATIONS

PCT International Search Report and Written Opinion dated Jul. 28, 2020 in PCT Patent Application No. PCT/ US2020/025572.

Restriction Requirement dated Nov. 15, 2021 in U.S. Appl. No. 16/666,077.

Response to Restriction Requirement dated Nov. 29, 2021 in U.S. Appl. No. 16/666,077.

Notice of Allowance dated Mar. 8, 2022 in U.S. Appl. No. 16/666,077.

* cited by examiner

BL    SGD    WL5    WL4    WL3    WL2    WL1    WL0    SGS    SL 468    470    472    474    476    475    477    478    480

462    464    466

438    440    442    444    446    445    447    448    450

432    434    436

First programming pass

Second programming pass

First programming pass

Second programming pass

907

WL1

WL0          928

WLDS          929

SGS          902

Oxide          904

SGSB          903

SGSB Ox          905

900

Etch the layer of polysilicon to form a first layer of polysilicon with a first thickness and a second layer of polysilicon with a second thickness greater than the first thickness ⟿970

Deposit a second dielectric layer within the second hole ⟿972

Deposit a layer of n-doped polysilicon that directly connects to a portion of the first layer of polysilicon ⟿974

BURIED SOURCE LINE STRUCTURE FOR BOOSTING READ SCHEME

PRIORITY DATA

This application is a divisional of U.S. patent application Ser. No. 16/666,077, entitled "Buried Source Line For Boosting Read Scheme", which application is incorporated herein by reference in its entirety for all purposes.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates (e.g., the source-side select gate and the drain-side select gate) may be referred to as a NAND string. In recent years, NAND flash memory has been scaled in order to reduce cost per bit. However, as process geometries shrink, many design and process challenges are presented. These challenges include reduced data retention, increased leakage currents, and increased variability in read currents.

DETAILED DESCRIPTION

Figure 1:
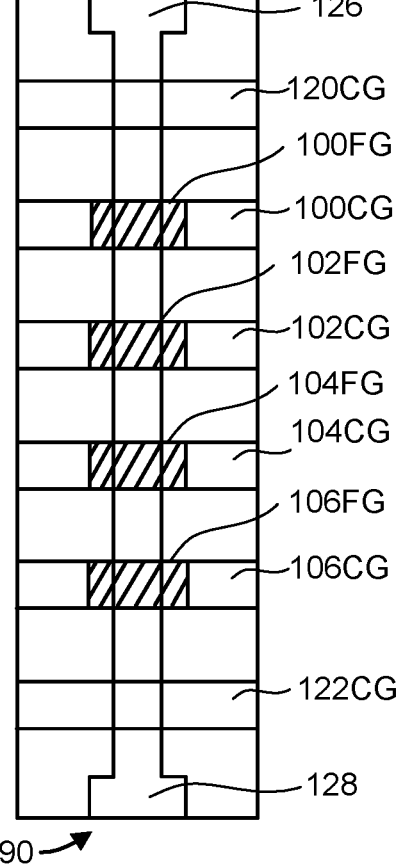
FIG. 1 depicts one embodiment of a NAND string.

Technology is described for reducing manufacturing cost and improving the reliability of non-volatile memory using NAND strings (e.g., vertical or horizontal NAND strings) with silicon-based or polysilicon channels and p-type doped source lines. A NAND string may include a polysilicon channel that is orthogonal to a substrate and connects to a boron doped source line at a source-side end of the NAND string. To reduce the likelihood of the polysilicon channel being cut-off or pinched near the source-side end of the NAND string or near the bottom of the vertically oriented NAND string, a thicker polysilicon channel may be formed near the source-side end of the NAND string while a thinner polysilicon channel may be formed for the remainder of the NAND string including the portion of the NAND string comprising the memory cell transistors. The thicker portion of the polysilicon channel and the thinner portion of the polysilicon channel may be formed simultaneously during the same polysilicon etch operation. The technical benefit of using a thinner polysilicon channel for the memory cell transistors is that a higher memory cell current may be achieved. The technical benefit of using a thicker polysilicon channel for the source-side select gate transistor or near the source-side end of the NAND string is that localized over-thinning of the polysilicon channel or channel cut-off may be prevented.

The thicker polysilicon channel (e.g., with a thickness of 10 nm) near the source-side end of the NAND string and the thinner polysilicon channel (e.g., with a thickness of 4 nm) for the remainder of the NAND string may be formed by diffusing boron into a first portion of the polysilicon channel from the source-side end of the NAND string corresponding with the thicker polysilicon channel and then etching the polysilicon channel with etchants that exhibit a reduction in their etch rate at elevated boron concentrations or at boron concentrations above a threshold concentration (e.g., greater than $10^{18}$ cm$^{-3}$ or greater than $10^{19}$ cm$^{-3}$). The boron may be diffused from a substrate or a source line layer into the first portion of the polysilicon channel via an annealing operation. In this case, the first portion of the polysilicon channel that has been infused with boron may have a reduced etch rate compared with the remaining portion of the polysilicon channel. The reduced etch rate will cause the first portion of the polysilicon channel to thin at a slower rate compared with the remaining portion of the polysilicon channel. In one example, the etching of the polysilicon channel may be performed with a wet etch process. The wet etch process may employ trimethyl-2-hydroxyethyl ammonium hydroxide (or TMY) as a primary etchant. In another example, a selective etch (e.g., employing an alkaline organic etch solution) may be used.

In one embodiment, the thicker portion of the polysilicon channel may be formed for one or more source-side select gate transistors of the NAND string while the thinner portion of the polysilicon channel may be formed for the memory cell transistors and one or more drain-side select gate transistors of the NAND string. In another embodiment, the thinner portion of the polysilicon channel may be formed for one or more source-side select gate transistors, the memory cell transistors, and one or more drain-side select gate transistors of the NAND string while the thicker portion of the polysilicon channel may be formed between the one or more source-side select gate transistors and the source line connection to the NAND string.

NAND strings may comprise a series of floating gate transistors or charge trap transistors. A charge trap transistor may comprise a silicon-oxide-nitride-oxide-silicon (SONOS), a metal-oxide-nitride-oxide-silicon (MONOS), or a metal-aluminum oxide-nitride-oxide-silicon (MANOS) device. The silicon component may comprise polycrystalline silicon, the oxide component may comprise silicon dioxide, and the nitride component may comprise silicon nitride.

In some embodiments, a NAND string may include a polysilicon channel connected to a p-type doped source line at the bottom of the NAND string closest to the substrate. During a boosted read operation for a selected memory cell transistor of the NAND string that utilizes a p-type doped source line, a back-gate bias or bit line voltage may be applied to a bit line connected to the NAND string and a source line voltage greater than the bit line voltage may be applied to a source line connected to the NAND string; with these bias conditions, electrons may be injected from the bit line and annihilated in the source line during the read operation. During the boosted read operation, the bit line may act as the source of free electrons with electron-hole recombination occurring at the source line and current flowing from the source line into the bit line; in contrast, during a conventional read operation with a NAND string that utilizes an n-type doped source line, the source line acts as the source of free electrons with current flowing from the bit line towards the source line.

The application of the back-gate bias to the bit line during the read operation of the NAND string that utilizes a p-type doped source line may improve the performance of the read operation due to the suppression of short channel effects and the reduction in neighboring word line interference. Neighboring word line interference or the amount of shifting in the programmed threshold voltage of a memory cell transistor due to a neighboring memory cell transistor connected to a neighboring word line being programmed subsequent to the prior programming of the threshold voltage of the memory cell transistor is greatest when the neighboring memory cell transistor is programmed to the highest data state (e.g., to the G-state in a three-bit per cell memory). As a NAND string with a polycrystalline silicon (or polysilicon) channel that is connected to a p-type doped (e.g., a boron-doped) source line may allow for higher programmed threshold voltages for the same applied programming voltage (e.g., Vpgm) to the selected word line as that used in a conventional NAND string with an n-type doped source line, the amount of neighboring word line interference during the programming of neighboring memory cell transistors may be reduced. Moreover, the application of the back-gate bias to the bit line during the read operation may also facilitate current sensing for sense amplifiers connected to the bit line.

In some embodiments, a memory block may include a plurality of NAND strings or NAND flash memory structures, such as vertical NAND structures or bit cost scalable (BiCS) NAND structures. Each NAND structure may comprise a NAND string that utilizes a p-type doped source line. A controller (or one or more control circuits) in communication with a memory block may determine a source line voltage to be applied to a source line connected to a NAND string within the memory block prior to a boosted read operation, determine a threshold voltage level for a threshold voltage of a source-side select gate transistor for the NAND string based on the source line voltage to be applied to the source line during the boosted read operation, and set the threshold voltage of the source-side select gate transistor for the NAND string to the threshold voltage level prior to performing the boosted read operation. In one example, prior to the boosted read operation, the threshold voltage of the source-side select gate transistor may be set to a negative threshold voltage (e.g., to minus three volts or −3V).

One technical issue with using NAND strings that utilize p-type doped source lines and biasing the source lines to a source line voltage greater than the bit line voltages applied to the bit lines connected to the NAND strings during a read operation is that substantial leakage current may occur within unselected NAND strings within unselected memory blocks that are connected to the same source lines as the selected memory blocks. As both source lines and bit lines may extend across both selected memory blocks and unselected memory blocks, unwanted channel current through the unselected NAND strings due to the forward bias applied to the source lines may cause increased power consumption and reduced battery lifetime. To avoid the unwanted leakage currents through the NAND strings in non-selected memory blocks, the threshold voltage levels of the source-side select gates may be set to a negative threshold voltage (e.g., to a negative threshold voltage level that has an absolute voltage value that is greater than the positive source line voltage applied to the source lines during the read operation). One technical benefit of setting the threshold voltages of the source-side select gates to a negative threshold voltage prior to the read operation is that holes injected into the channels of the unselected NAND strings from the source lines during the read operation may be blocked and the leakage currents through the unselected NAND strings may be significantly reduced.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
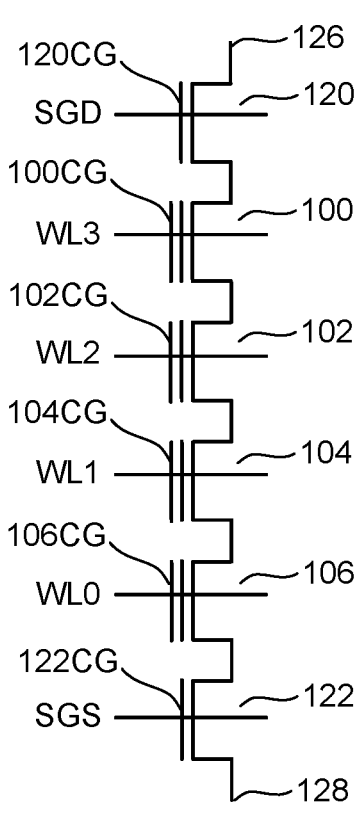
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells may be referred to as dummy memory cells because they do not store user accessible data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
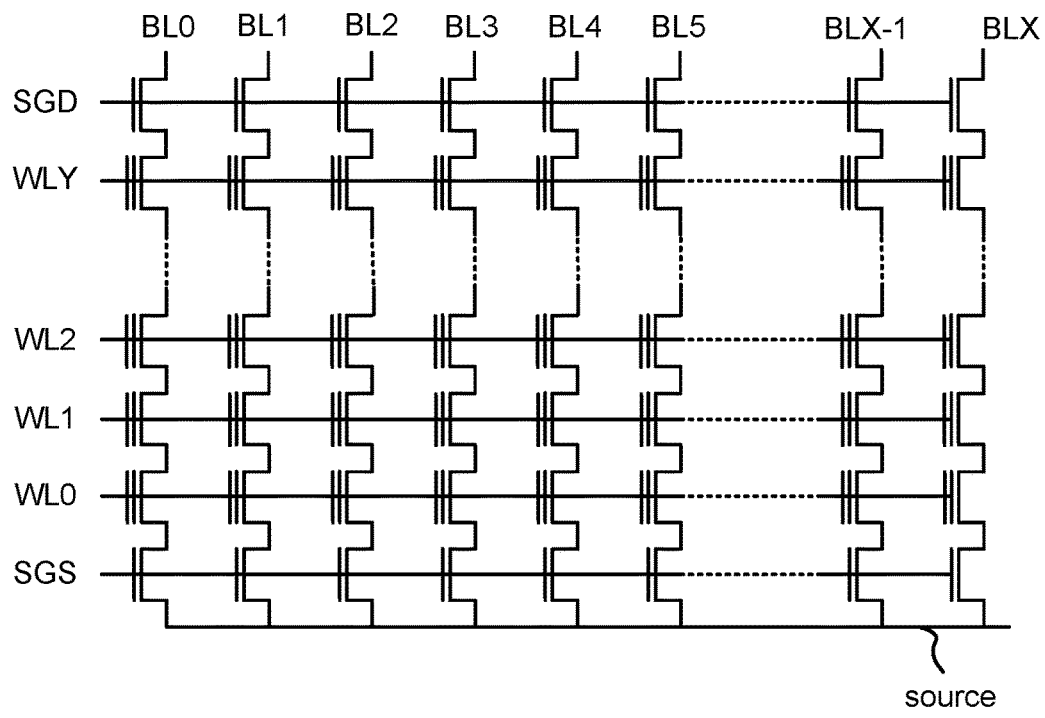
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
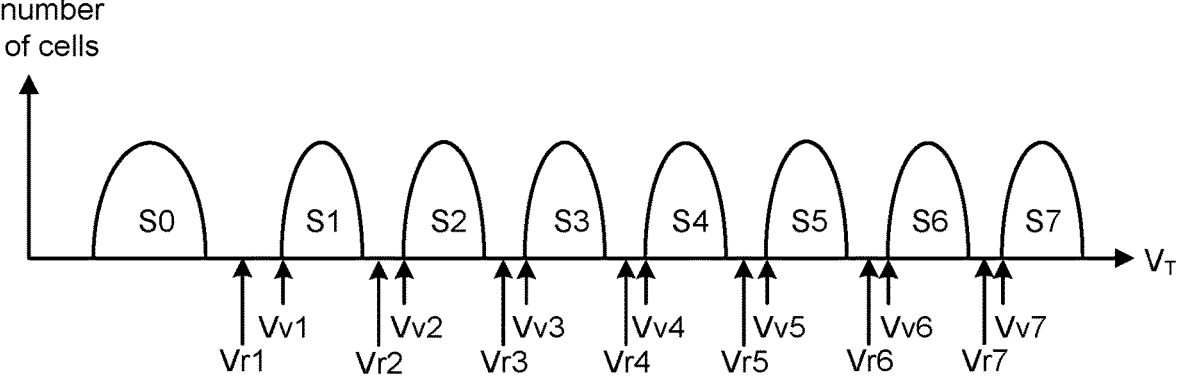
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
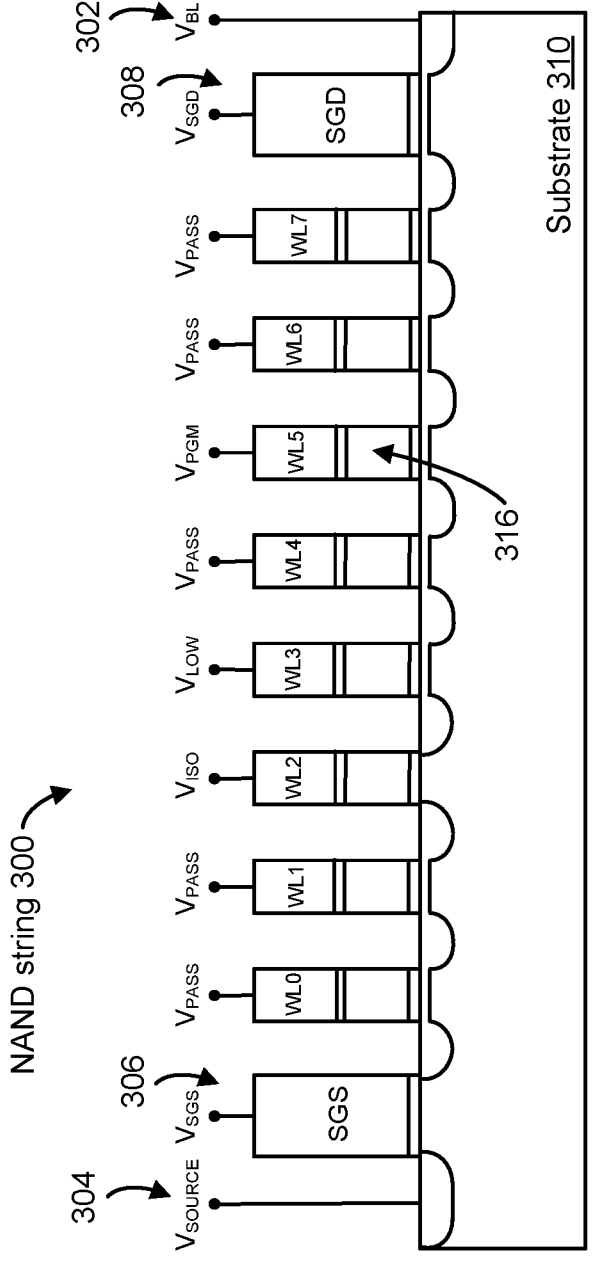
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to $V_{BL}$ and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 4A:
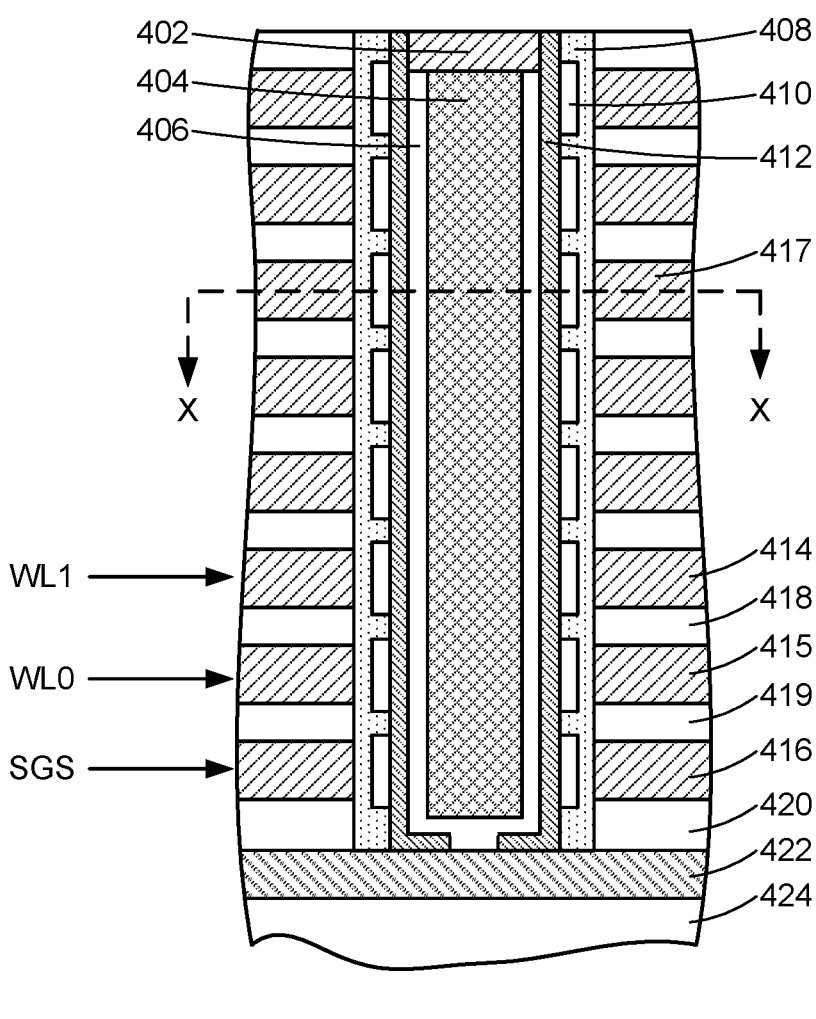
FIG. 4A depicts one embodiment of a vertical NAND structure.

FIG. 4A depicts one embodiment of a vertical NAND structure. The vertical NAND structure includes an inverted NAND string formed above the substrate 424 and oriented such that the inverted NAND string is orthogonal to the substrate 424. An inverted NAND string may comprise a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programing and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a tunneling layer material 408 (e.g., including a thin oxide), a floating gate material 410 (e.g., polysilicon), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may comprise a portion of a multi-layer dielectric stack such as an ONO dielectric stack, which includes alternating layers of silicon dioxide ("O") and silicon nitride ("N"). In some cases, the tunneling layer material 408 may comprise a high-K dielectric material (e.g., hafnium-based high-K dielectrics or hafnium oxide) that has a dielectric constant that is greater than that of silicon dioxide. In some cases, a core material layer 404 (e.g., oxide) may be formed within the memory hole. In other cases, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this case, the bit line contact layer 402 connects to the inverted NAND string at the top of the memory hole and the source line contact layer 422 connects to the inverted NAND string at the bottom of the memory hole.

In one embodiment, the bit line contact layer 402 may comprise a material of a first conductivity type (e.g., n-type) and the source line contact layer 422 may comprise a material of a second conductivity type different from the first conductivity type (e.g., p-type). In one example, the bit line contact layer 402 may comprise an n-type material (e.g., n-type polysilicon) and the source line contact layer 422 may comprise a p-type material (e.g., p-type polysilicon). In another example, the bit line contact layer 402 may comprise a p-type material and the source line contact layer 422 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

In one embodiment, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
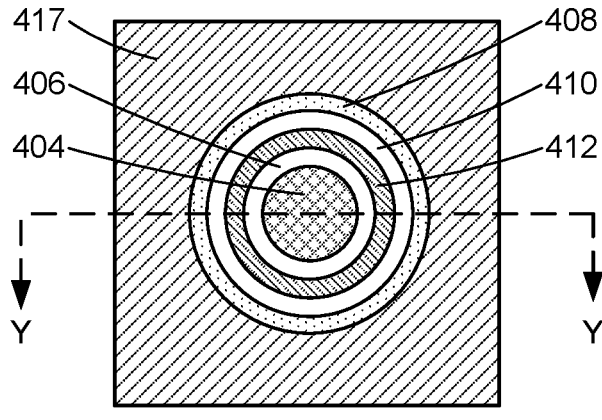
FIG. 4B depicts one embodiment of a cross-sectional view taken along line X-X of FIG. 4A.

FIG. 4B depicts one embodiment of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the floating gate material 410 that is surrounded by the tunneling layer material 408 that is surrounded by the control gate material layer 417. In one embodiment, FIG. 4A may depict a cross-sectional view taken along line Y-Y of FIG. 4B. In one embodiment, the inverted NAND string may be formed using a vertical cylindrical structure or a vertical tapered cylindrical structure. In this case, the dielectric material 412, floating gate material 410, tunneling layer material 408, and channel layer material 406 of the inverted NAND string may comprise vertical annular structures surrounding the core material layer 404. In another embodiment, the inverted NAND string may be formed using a vertical pillar structure or a vertical rectangular prism structure.

Figures 4C, 4D, 4E:
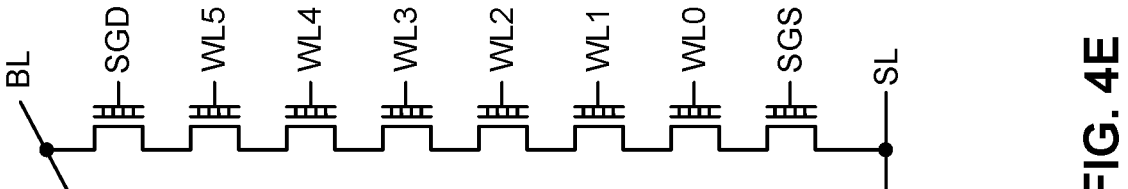
FIGS. 4C-4D depict various embodiment of vertical NAND structures.
FIG. 4E depicts one embodiment of a schematic representation of an inverted NAND string.

FIG. 4C depicts another embodiment of a vertical NAND structure. The vertical NAND structure includes an inverted NAND string formed above the substrate 450 and oriented such that the inverted NAND string is orthogonal to the substrate 450. The inverted NAND string may be arranged within a vertical memory hole that is etched through alternating layers of control gate material (e.g., tungsten, nitride, or polysilicon) and inter-gate insulator material (e.g., oxide or silicon oxide). As depicted, the layers of control gate material include layers 444-445 and the layers of inter-gate insulator material include layers 446-447. The inter-gate insulator material layer 447 may be arranged above a source line layer 448 (e.g., doped polysilicon) that may be arranged above the substrate 450 (e.g., a silicon substrate). In some cases, a first word line may correspond with control gate layer 444 and a second word line may correspond with control gate layer 445.

In one embodiment, within the memory hole a tunneling layer material 438 (e.g., including a thin oxide), a charge trap layer material 440 (e.g., silicon nitride), a dielectric layer 442 (e.g., oxide), and a channel layer material 436 (e.g., undoped polysilicon) may be deposited within the memory hole and arranged in order to form the inverted NAND string. As depicted in FIG. 4C, the tunneling layer material 438 may be arranged within or inside of the memory hole. The tunneling layer material 438 may comprise a portion of a multi-layer dielectric stack such as an ONO dielectric stack, which includes alternating layers of silicon dioxide ("O") and silicon nitride ("N"). In some cases, a core material layer 434 (e.g., oxide) may be formed within the memory hole. In other cases, the core material layer 434 may be omitted. A bit line contact layer 432 may be formed at the top of the memory hole and connect to the channel layer material 436. The channel layer material 436 may connect to the source line layer 448 at the bottom of the memory hole. Thus, in this case, the bit line contact layer 432 connects to the inverted NAND string at the top of the memory hole and the source line contact layer 448 connects to the inverted NAND string at the bottom of the memory hole.

In one embodiment, the bit line contact layer 432 may comprise a material of a first conductivity type (e.g., n-type) and the source line contact layer 448 may comprise a material of a second conductivity type different from the first conductivity type (e.g., p-type). In one example, the bit line contact layer 432 may comprise an n-type material (e.g., n-type polysilicon) and the source line contact layer 448 may comprise a p-type material (e.g., p-type polysilicon). In another example, the bit line contact layer 432 may comprise a p-type material (e.g., p-type polysilicon) and the source line contact layer 448 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

FIG. 4D depicts another embodiment of a vertical NAND structure. The vertical NAND structure includes an inverted NAND string formed above the substrate 480 and oriented such that the inverted NAND string is orthogonal to the substrate 480. The inverted NAND string may be arranged within a vertical memory hole that is etched through alternating layers of control gate material (e.g., tungsten, nitride, or polysilicon) and inter-gate insulator material (e.g., oxide or silicon oxide). As depicted, the layers of control gate material include layers 474-475 and the layers of inter-gate insulator material include layers 476-477. The inter-gate insulator material layer 477 may be arranged above a source line layer 478 (e.g., doped polysilicon) that may be arranged above the substrate 480 (e.g., a silicon substrate). In some cases, a first word line may correspond with control gate layer 474 and a second word line may correspond with control gate layer 475.

In one embodiment, within the memory hole a tunneling layer material 468 (e.g., including a thin oxide), a floating gate material 470 (e.g., polysilicon), a dielectric layer 472 (e.g., oxide), and a channel layer material 466 (e.g., undoped polysilicon) may be arranged in order to form the inverted NAND string. As depicted in FIG. 4D, the tunneling layer material 468 is arranged outside of the memory hole structure. The tunneling layer material 468 may comprise a portion of a multi-layer dielectric stack such as an ONO dielectric stack, which includes alternating layers of silicon dioxide ("O") and silicon nitride ("N"). In some cases, a core material layer 464 (e.g., oxide) may be formed within the memory hole. In other cases, the core material layer 464 may be omitted. A bit line contact layer 462 may be formed at the top of the memory hole and connect to the channel layer material 466. The channel layer material 466 may connect to the source line layer 478 at the bottom of the memory hole. Thus, in this case, the bit line contact layer 462 connects to the inverted NAND string at the top of the memory hole and the source line contact layer 478 connects to the inverted NAND string at the bottom of the memory hole.

In one embodiment, the bit line contact layer 462 may comprise a material of a first conductivity type (e.g., n-type) and the source line contact layer 478 may comprise a material of a second conductivity type different from the first conductivity type (e.g., p-type). In one example, the bit line contact layer 462 may comprise an n-type material (e.g., n-type polysilicon) and the source line contact layer 478 may comprise a p-type material (e.g., p-type polysilicon). In another example, the bit line contact layer 462 may comprise a p-type material and the source line contact layer 478 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

FIG. 4E depicts one embodiment of a schematic representation of an inverted NAND string. As depicted, the inverted NAND string includes eight transistors in series between a source line (SL) and a bit line (BL). In some embodiments, the eight transistors may correspond with the eight transistors depicted in FIG. 4A, the eight transistors depicted in FIG. 4C, or the eight transistors depicted in FIG. 4D. The gate of the drain-side select transistor is connected to SGD and the gate of the source-side select transistor is connected to SGS. Between the drain-side select transistor and the source-side select transistors is six memory cell transistors connected in series and each connected to one of the word lines WL0 through WL5. Although the inverted NAND string depicted in FIG. 4E includes only six memory cell transistors, other inverted NAND strings may comprise two or more memory cell transistors in series (e.g., 32 memory cell transistors or 64 memory cell transistors). In one embodiment, a memory cell transistor within an inverted NAND string may comprise an inverted floating gate transistor with a tunneling layer (e.g., a tunneling oxide) between a floating gate of the inverted floating gate transistor and a control gate of the inverted floating gate transistor. The floating gate may comprise polysilicon. In another embodiment, a memory cell transistor within an inverted NAND string may comprise an inverted charge trap transistor with a tunneling layer (e.g., a tunneling oxide) between a charge trap layer of the inverted charge trap transistor and a control gate of the inverted charge trap transistor. The charge trap layer may comprise silicon nitride.

In some cases, a vertical NAND structure may comprise a vertical NAND string or a vertical inverted NAND string. A NAND string may comprise a string of floating gate transistors. An inverted NAND string may comprise a string of inverted floating gate transistors.

Figure 5:
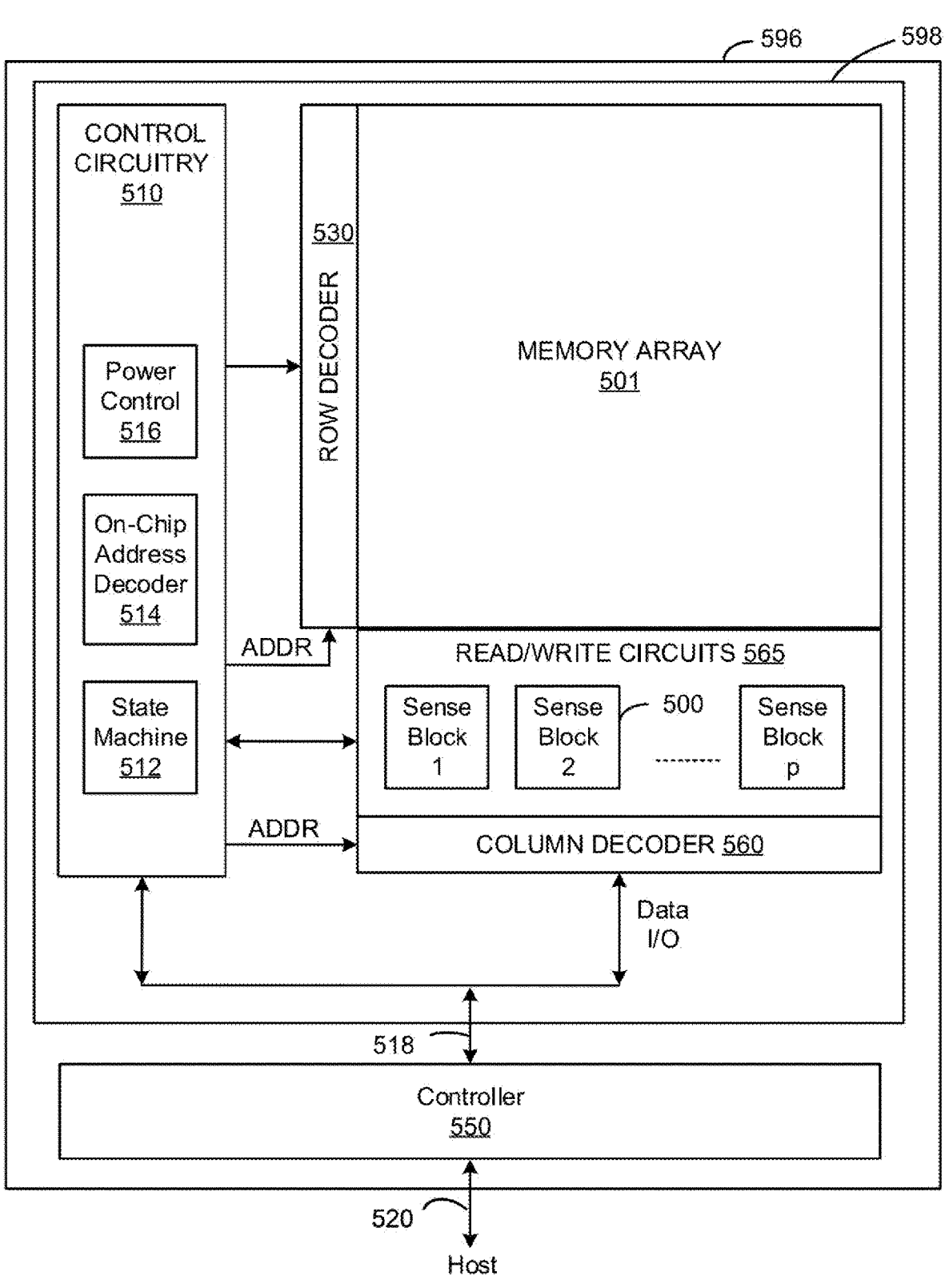
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
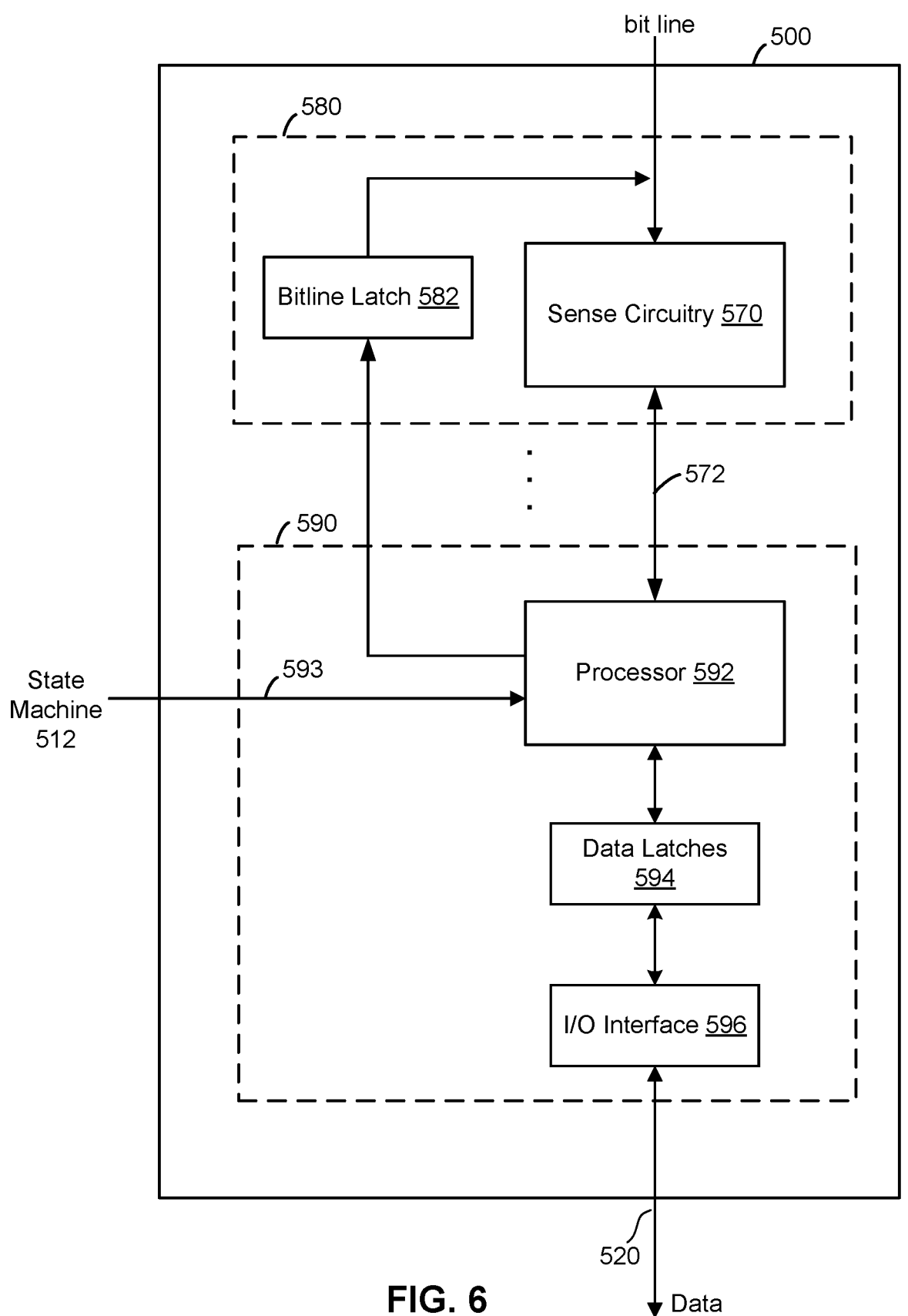
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
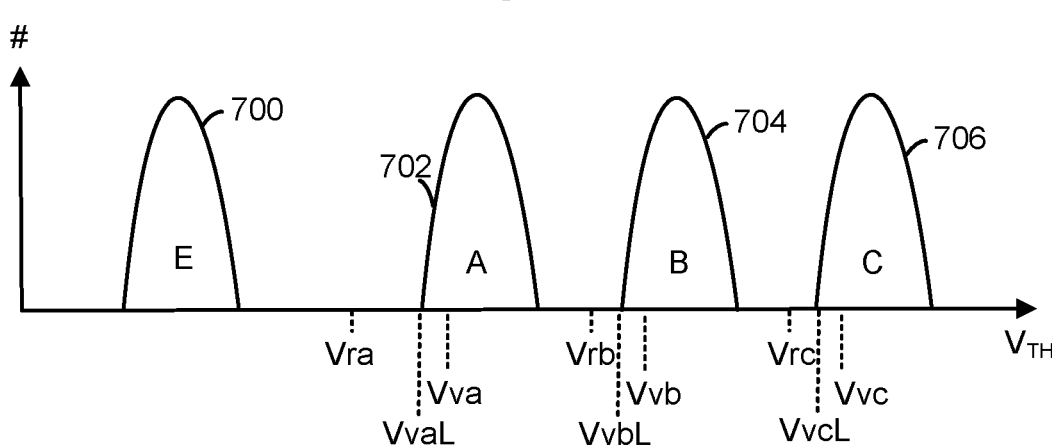
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
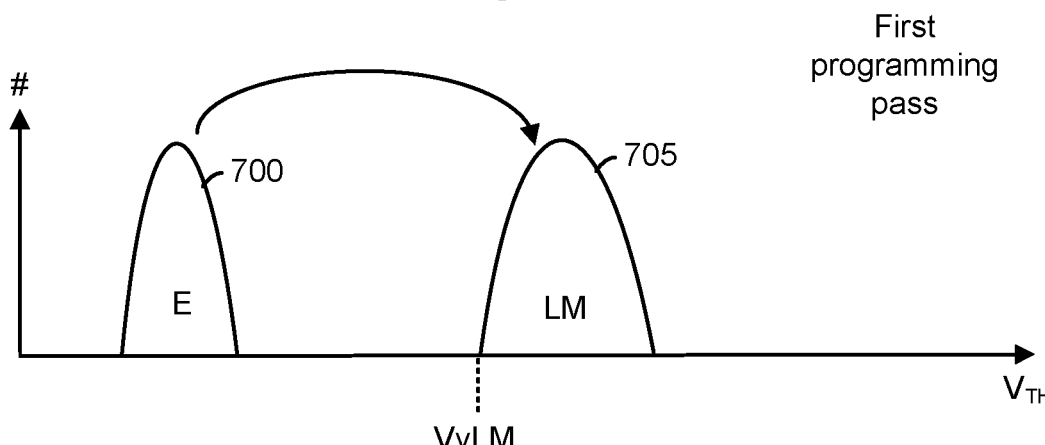
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705). In one embodiment, after a storage element is programmed from the E-state to the LM-state, its neighbor storage element on an adjacent word line WLn+1 in the NAND string will then be programmed with respect to its lower page in a respective first programming pass of the adjacent word line.

Figure 7C:
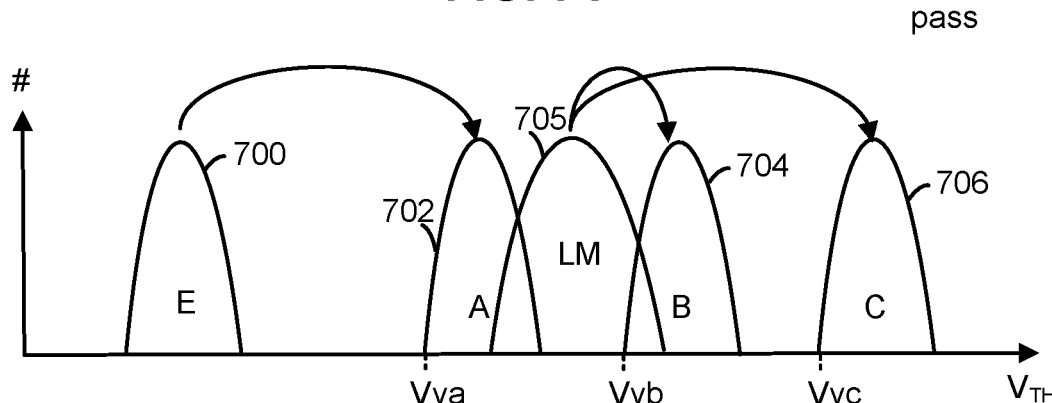
FIG. 7C depicts one embodiment of a second pass of the two-pass programming technique.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706.

Figure 7D:
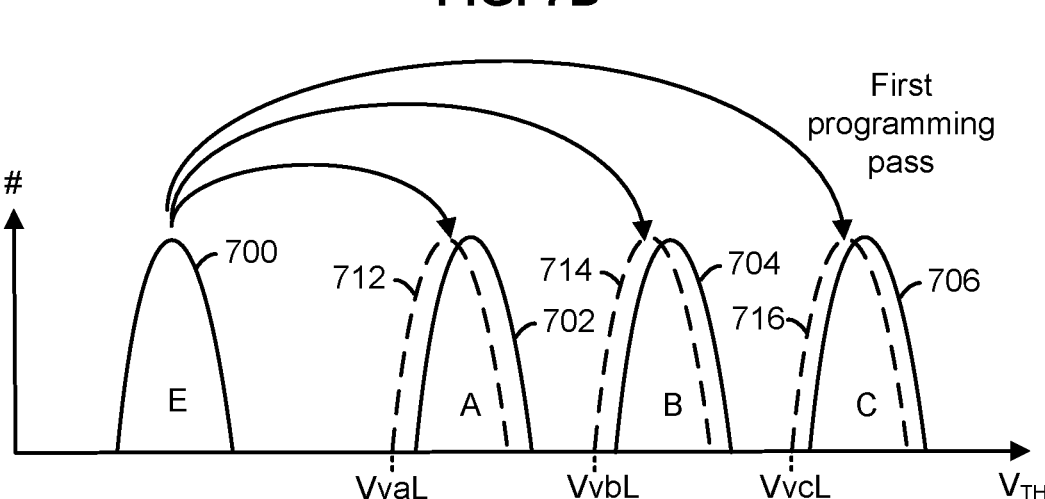
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
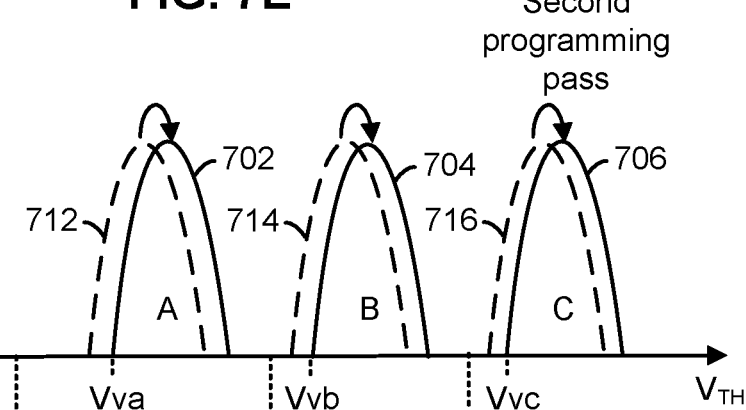
FIG. 7E depicts one embodiment of a second pass of the two-pass programming technique.
Figure 7F:
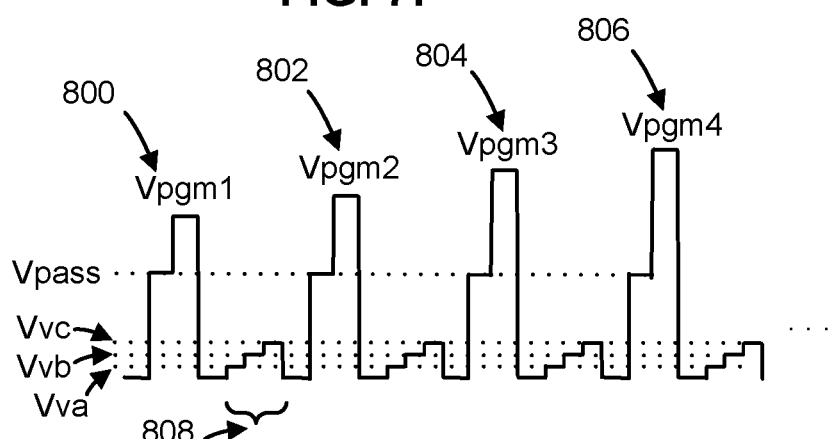
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower verify distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state.

FIG. 7F depicts one embodiment of a series of program and verify pulses which are applied to a selected word line during a programming operation. A programming operation may include multiple program-verify iterations, where each iteration applies one or more programming pulses followed by one or more verify pulses (e.g., to verify or determine the programming state or the programming level of a memory cell) to a selected word line. In one embodiment, the programming pulses are stepped up in successive iterations. Moreover, each programming pulse may include a first portion which has a pass voltage (Vpass) level, e.g., 6-8 V, followed by a second, highest amplitude portion at a programming voltage (Vpgm) level, e.g., 12-25 V. For example, as depicted in FIG. 7F, a first, second, third, and fourth programming pulses 800, 802, 804 and 806 have programming voltage levels of Vpgm1, Vpgm2, Vpgm3 and Vpgm4, respectively. One or more verify voltages 808, such as verify voltages Vva, Vvb and Vvc, may be provided after each programming pulse. In some cases, one or more initial programming pulses are not followed by verify pulses because it is not expected that any storage elements could have reached the lowest program state (e.g., A-state). Subsequently, in some cases, programming iterations may use verify pulses for the A-state, followed by programming iterations which use verify pulses for the A-states and B-states, followed by programming iterations which use verify pulses for the B-states and C-states.

Figure 8A:
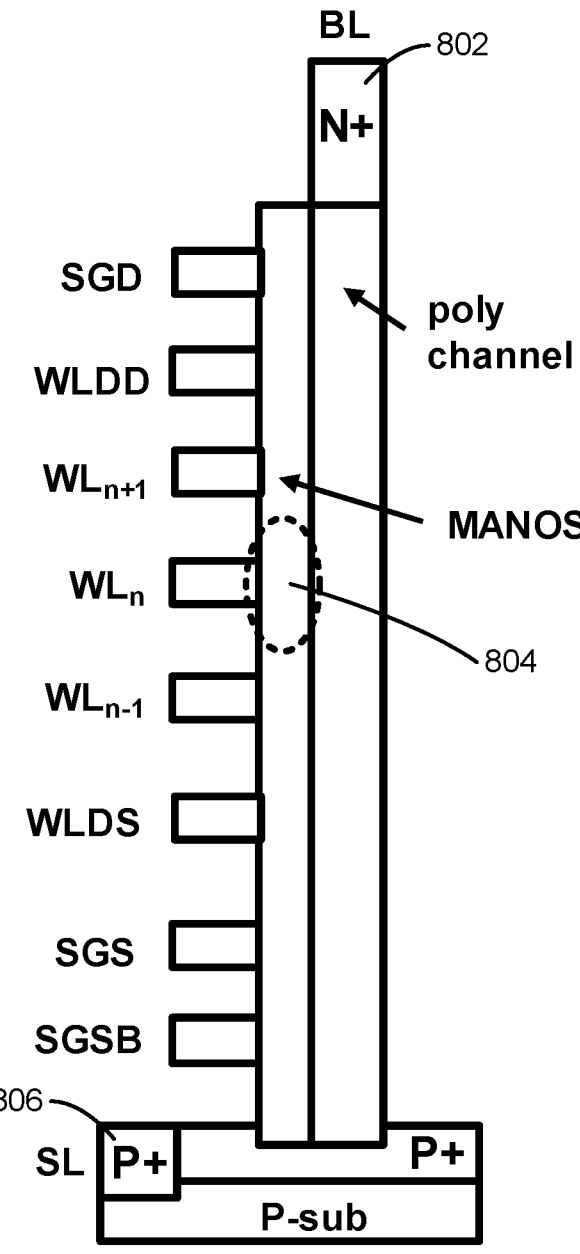
FIG. 8A depicts one embodiment of a vertical NAND string that connects to a p-type doped source line.

FIG. 8A depicts one embodiment of a vertical NAND string that connects to a p-type doped source line. As depicted, the vertical NAND string includes a drain-side select gate transistor controlled by the drain-side select gate line SGD, a drain-side dummy transistor controlled by the dummy word line WLDD, a plurality of memory cell transistors corresponding with word lines WL(n+1) through WL(n−1), a source-side dummy transistor controlled by the dummy word line WLDS, a first source-side select gate transistor controlled by the source-side select gate line SGS, and a second source-side select gate transistor controlled by the source-side select gate line SGSB. The second source-side select gate transistor may correspond with the source-side select gate transistor depicted in FIG. 3A that directly connects to the source line. The drain-side select gate transistor connects to a bit line 802 and the source-side select gate transistor that is controlled by the source-side select gate line SGSB connects to a source line 806. The source line 806 may comprise boron-doped silicon or boron-doped polysilicon. The vertical NAND string includes a polysilicon channel that extends between the bit line 802 and the source line 806. The vertical NAND string may include a vertical charge trapping layer, a vertical MANOS layer, or a vertical TANOS layer arranged between the word lines and the polysilicon channel. During a read operation, the threshold voltage of a selected memory cell transistor 804 corresponding with word line WL(n) may be determined by setting the unselected memory cell transistors within the vertical NAND string into conducting states (e.g., by applying Vread or 8V to the unselected word lines connected to the unselected memory cell transistors) and applying a read bias voltage (e.g., by applying Vcgrv or 3V) to the selected word line WL(n) connected to the selected memory cell transistor. The read bias voltage may be less than the voltages applied to the unselected word lines during the read operation.

Figure 8B:
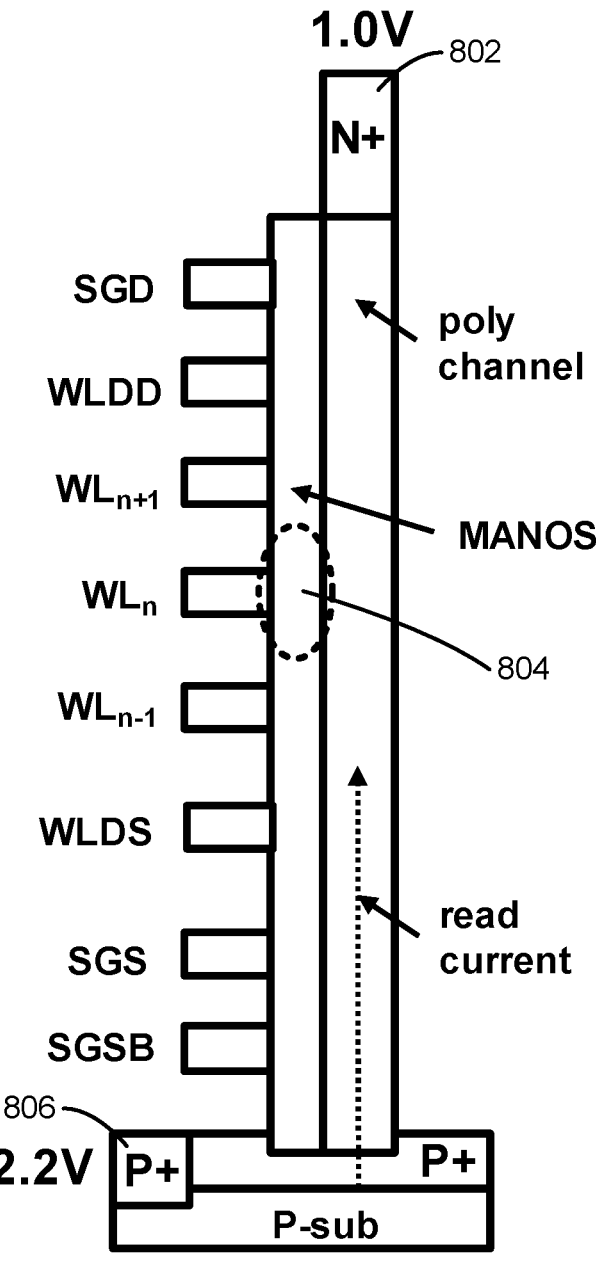
FIG. 8B depicts one embodiment of the vertical NAND string depicted in FIG. 8A during a read operation.

FIG. 8B depicts one embodiment of the vertical NAND string depicted in FIG. 8A during a read operation. As depicted, the bit line 802 has been biased to a bit line voltage of 1.0V and the source line 806 has been biased to a source line voltage of 2.2V. As the source line voltage is greater than the bit line voltage, the read current flows from the source line 806 to the bit line 802. In this case, the threshold voltage of the selected memory cell transistor 804 may be less than the voltage applied to the selected word line WL(n) such that the read current flows towards the bit line 802 to charge an integration capacitor or node within a sense amplifier electrically connected to the bit line 802. The accumulation of charge due to the read current may be sensed by the sense amplifier in order to determine a data state corresponding with the threshold voltage of the selected memory cell transistor 804. The sensing circuitry may correspond with read/write circuits 565 in FIG. 5.

In one embodiment, if a data error is detected during the read operation, then a controller, such as control circuitry 510 in FIG. 5 or controller 550 in FIG. 5, may adjust the source line voltage and/or the bit line voltage applied to the vertical NAND string during a subsequent read operation. The data error may be detected as an ECC error or as one or more bit errors within data read during the read operation. In one example, if one or more bit errors are detected within the data read during the read operation, then the controller may reduce the voltage applied to the bit line 802 (e.g., reduce the bit line voltage from 1.0V to 0.8V) and/or increase the source line voltage (e.g., increase the source line voltage from 2.2V to 2.4V) and perform a subsequent read operation in order to reduce the number of one or more bit errors. In another example, if the number of ECC errors or the number of bit errors within data read during the read operation is greater than a threshold number of bit errors (e.g., is greater than two bit errors), then the voltage difference between the source line voltage and the bit line voltage may be increased during a subsequent read operation (e.g., the bit line voltage may remain at 1.0V while the source line voltage is increased from 2.2V to 2.5V for the subsequent read operation).

In some embodiments, the memory cell transistors of the vertical NAND string may comprise a vertical string of charge trap transistors. In other embodiments, the memory cell transistors of the vertical NAND string may comprise a vertical string of floating gate transistors. In other embodiments, the memory cell transistors of the vertical NAND string may comprise a vertical string of inverted charge trap transistors. In other embodiments, the memory cell transistors of the vertical NAND string may comprise a vertical string of inverted floating gate transistors.

During a programming operation, electrons may be selectively injected from the bit line 802 connected to the vertical NAND string depending on the bit line voltage applied to the bit line during the programming operation. The programming of memory cell transistors may begin with memory cell transistors arranged closest to the source line 806, such as the memory cell transistor controlled by word line WL(n−1), and progress towards the memory cell transistors arranged closest to the bit line 802, such as the memory cell transistor controlled by word line WL(n+1). In one example, the memory cell transistor corresponding with word line WL1 may be programmed first followed by the memory cell transistor corresponding with word line WL2.

Figures 8C, 8D:
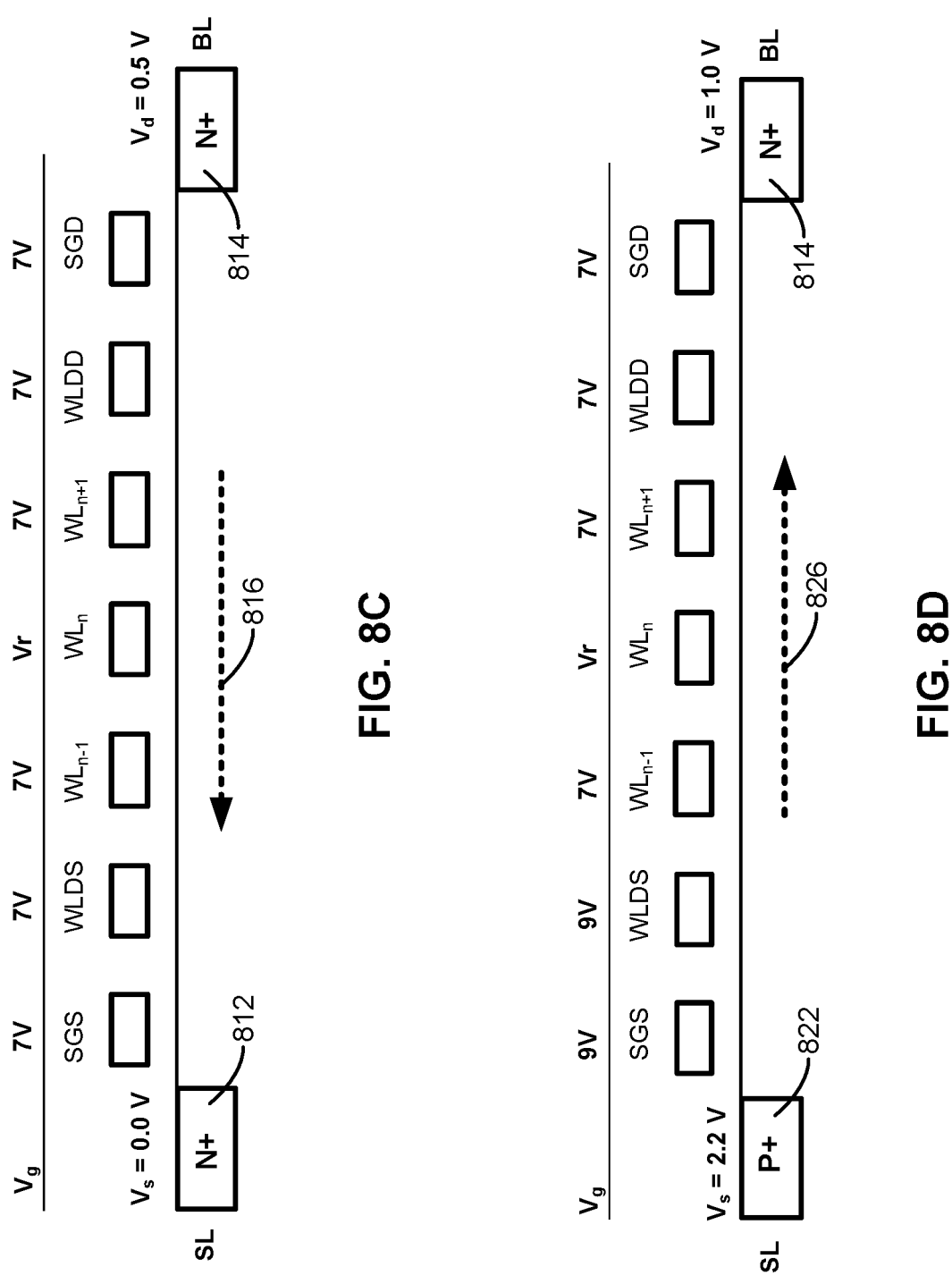
FIG. 8C depicts one embodiment of a conventional NAND string with an n-type source line and an n-type bit line during a read operation.
FIG. 8D depicts one embodiment of a NAND string with a p-type source line and an n-type bit line during a read operation.

FIG. 8C depicts one embodiment of a conventional NAND string with an n-type source line 812 and an n-type bit line 814 during a read operation. As depicted, the source line 812 has been set to a source line voltage of 0V and the bit line 814 has been set to a bit line voltage of 0.5V. The unselected word lines corresponding with word lines WL(n−1) and WL(n+1) have been set to 7V, the drain-side select gate line SGD has been set to 7V, the drain-side dummy word line WLDD has been set to 7V, the source-side dummy word line WLDS has been set to 7V, the source-side select gate line SGS has been set to 7V, and the selected word line WL(n) that controls the control gate of the selected memory cell transistor has been set to a read bias voltage Vr (e.g., 3V or 3.5V). In this case, as the threshold voltage of the selected memory cell transistor is less than the read bias voltage Vr, a read current 816 flows from the bit line 814 to the source line 812.

FIG. 8D depicts one embodiment of a NAND string with a p-type source line 822 and an n-type bit line 814 during a read operation. As depicted, the source line 822 has been set to a source line voltage of 2.2V and the bit line 814 has been set to a bit line voltage of 1.0V. The unselected word lines corresponding with word lines WL(n−1) and WL(n+1) have been set to 7V, the drain-side select gate line SGD has been set to 7V, the drain-side dummy word line WLDD has been set to 7V, the source-side dummy word line WLDS has been set to 9V, the source-side select gate line SGS has been set to 9V, and the selected word line WL(n) that controls the control gate of the selected memory cell transistor has been set to a read bias voltage Vr (e.g., 3V). As the threshold voltage of the selected memory cell transistor is less than the read bias voltage Vr, a read current 826 flows from the source line 822 to the bit line 814.

Figures 8E, 8F:
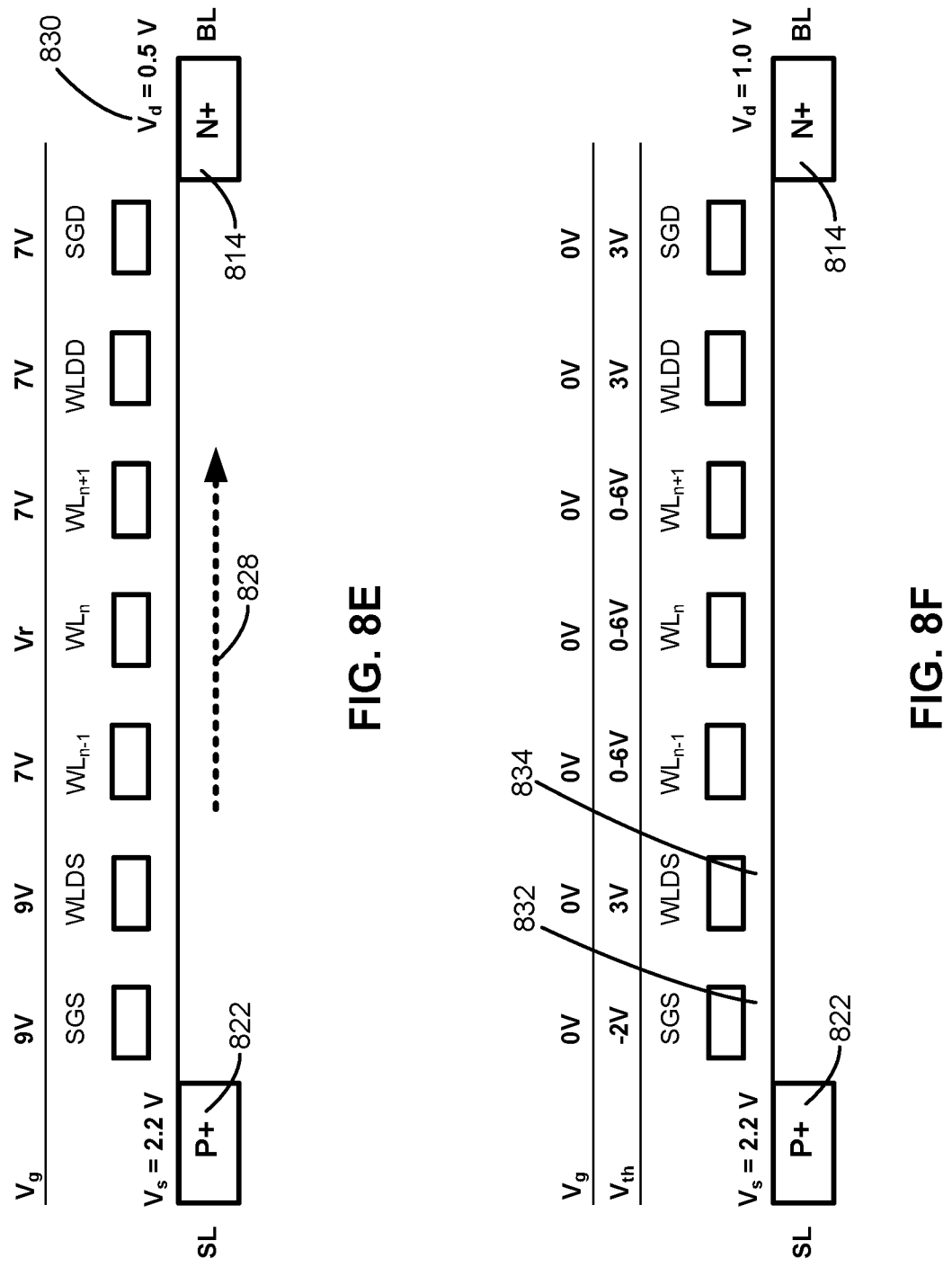
FIG. 8E depicts one embodiment of the NAND string of FIG. 8D during a second read operation in which the bit line voltage has been reduced from 1.0V to 0.5V.
FIG. 8F depicts one embodiment of an unselected NAND string within an unselected memory block.

FIG. 8E depicts one embodiment of the NAND string of FIG. 8D during a second read operation in which the bit line voltage has been reduced from 1.0V to 0.5V. As the threshold voltage of the selected memory cell transistor is less than the read bias voltage Vr, a read current 828 flows from the source line 822 to the bit line 814. The read current 828 may be greater than the read current 826 in FIG. 8D. The adjustment made to the bit line voltage 830 may be determined by a controller based on a number of bit errors detected during a prior read operation. The number of bit error may be determined by ECC circuitry. For example, if the number of bit errors during the prior read operation is greater than two bit errors, then the bit line voltage 830 may be reduced by 500 mV. The adjustment made to the bit line voltage 830 may also be determined by a controller based on a temperature during a read operation. For example, if a chip temperature is greater than a threshold temperature (e.g., is greater than 70 degrees Celsius), then the bit line voltage 830 may be reduced by 200 mV.

FIG. 8F depicts one embodiment of an unselected NAND string within an unselected memory block. As the source line voltage applied to a selected memory block may also be applied to unselected memory blocks, the source line voltage applied to the source line 822 may cause leakage current to flow within the unselected NAND string even though the word lines and source-side select gate lines of the unselected NAND string have been set to 0V. To reduce the leakage current, the threshold voltages of the source-side select gate transistors of the selected and unselected memory blocks may be set to a negative threshold voltage prior to performance of read operations. As depicted, the threshold voltage of the source-side select gate transistor 832 has been set to −2V and the threshold voltage of the source-side dummy transistor 834 has been set to 3V.

In some embodiments, the threshold voltage of the source-side select gate transistor may be set based on the source line voltage applied to the source line 822 during read operations. In one example, a controller may determine that the source line voltage applied to source lines during a first read operation will be a first voltage (e.g., 2.0V) and in response the controller may cause the threshold voltages of the source-side select gate transistors to be set to a negative threshold voltage that has an absolute value that is greater than the first voltage (e.g., −2.2V). Prior to performance of a second read operation, the controller may determine that the source line voltage applied to source lines during the second read operation will be a second voltage greater than the first voltage (e.g., 2.5V) and in response the controller may cause the threshold voltages of the source-side select gate transistors to be set to a negative threshold voltage that has an absolute value that is greater than the second voltage (e.g., −3V).

Figures 8G, 8H:
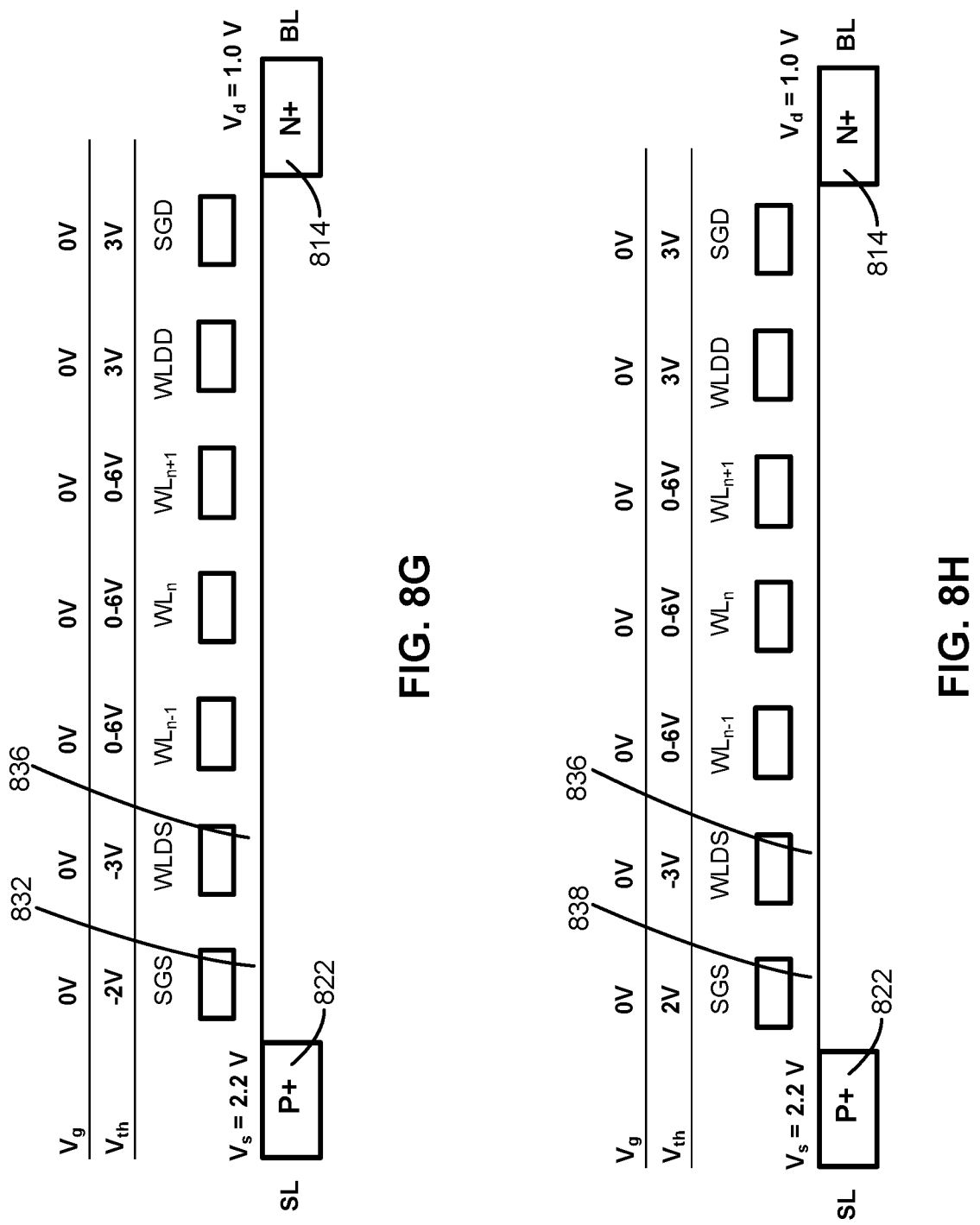
FIG. 8G depicts another embodiment of an unselected NAND string within an unselected memory block.
FIG. 8H depicts another embodiment of an unselected NAND string within an unselected memory block.

FIG. 8G depicts one embodiment of an unselected NAND string within an unselected memory block. As the source line voltage applied to a selected memory block may also be applied to unselected memory blocks, the source line voltage applied to the source line 822 may cause leakage current to flow within the unselected NAND string even though the word lines and source-side select gate lines of the unselected NAND string have been grounded or set to 0V. To reduce the leakage current, the threshold voltages of the source-side select gate transistors and the source-side dummy transistors may be set to negative threshold voltages prior to performance of read operations. As depicted, the threshold voltage of the source-side select gate transistor 832 has been set to −2V and the threshold voltage of the source-side dummy transistor 836 has been set to −3V. In some cases, the threshold voltage applied to the source-side dummy transistor that is adjacent to the source-side select gate transistor of a NAND string may be less or more negative than the threshold voltage applied to the source-side select gate transistor.

FIG. 8H depicts one embodiment of an unselected NAND string within an unselected memory block. As the source line voltage applied to a selected memory block may also be applied to unselected memory blocks to improve physical layout efficiency, the source line voltage applied to the source line 822 may cause leakage current to flow within the unselected NAND string even though the word lines and source-side select gate lines of the unselected NAND string have been grounded. To reduce the leakage current, the threshold voltages of the source-side dummy transistors of the selected and unselected memory blocks may be set to a negative threshold voltage prior to performance of read operations. As depicted, the threshold voltage of the source-side select gate transistor 838 has been set to 2V and the threshold voltage of the source-side dummy transistor 836 has been set to −3V. In some cases, the threshold voltage of the source-side dummy transistor 836 may be set to a negative threshold voltage that has an absolute value that is greater than the source line voltage applied to the source line 822. For example, if the source line voltage is 2.2V, then the threshold voltage of the source-side dummy transistor 836 may be set to −2.3V or −3V.

Figure 9A:
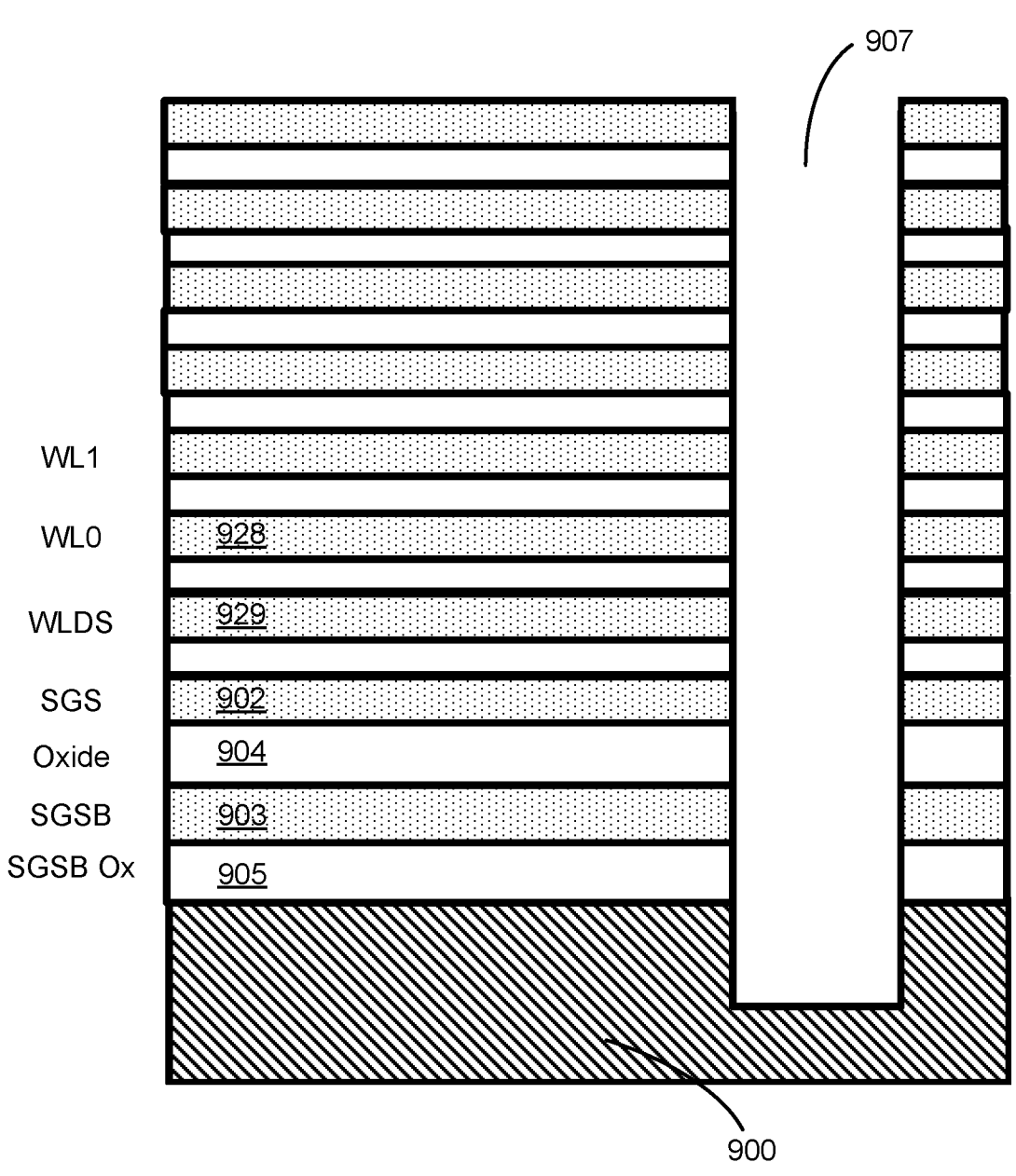
FIGS. 9A-9G depict various embodiments of stages of fabrication of a vertical NAND string using cross-sectional views and may be referred to when describing the processes of FIGS. 9H-9J.
Figure 9B:
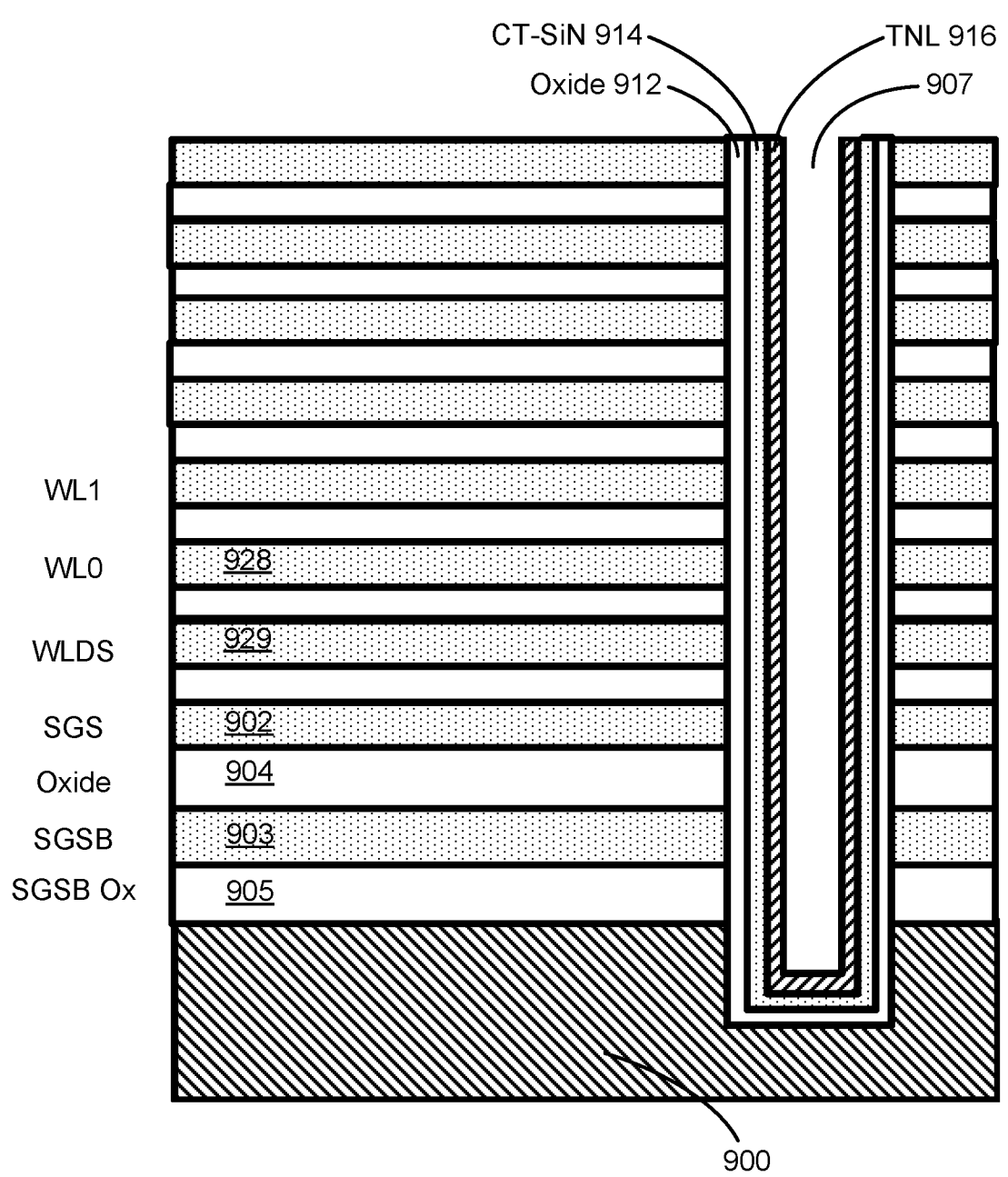
Figure 9C:
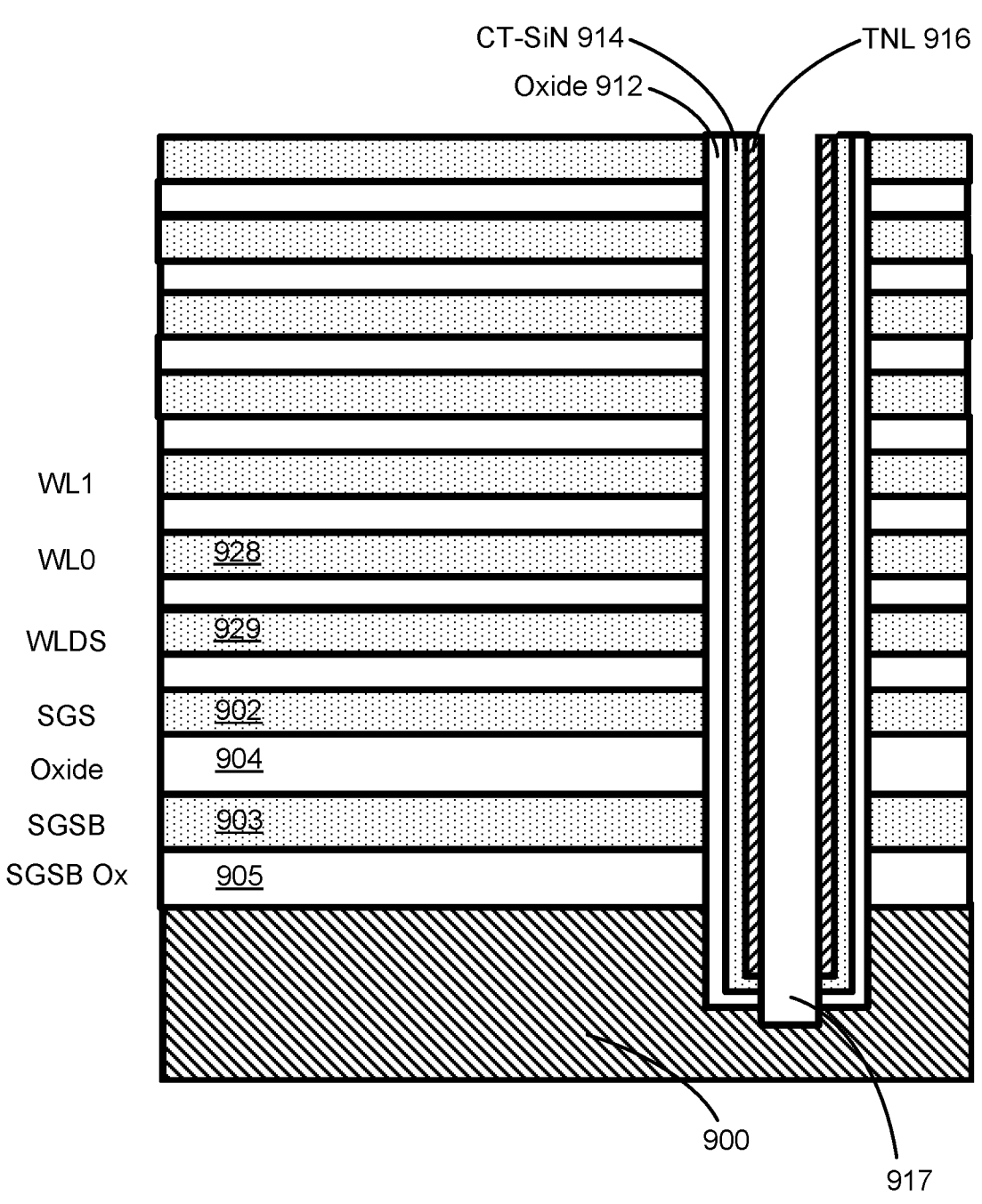
Figure 9D:
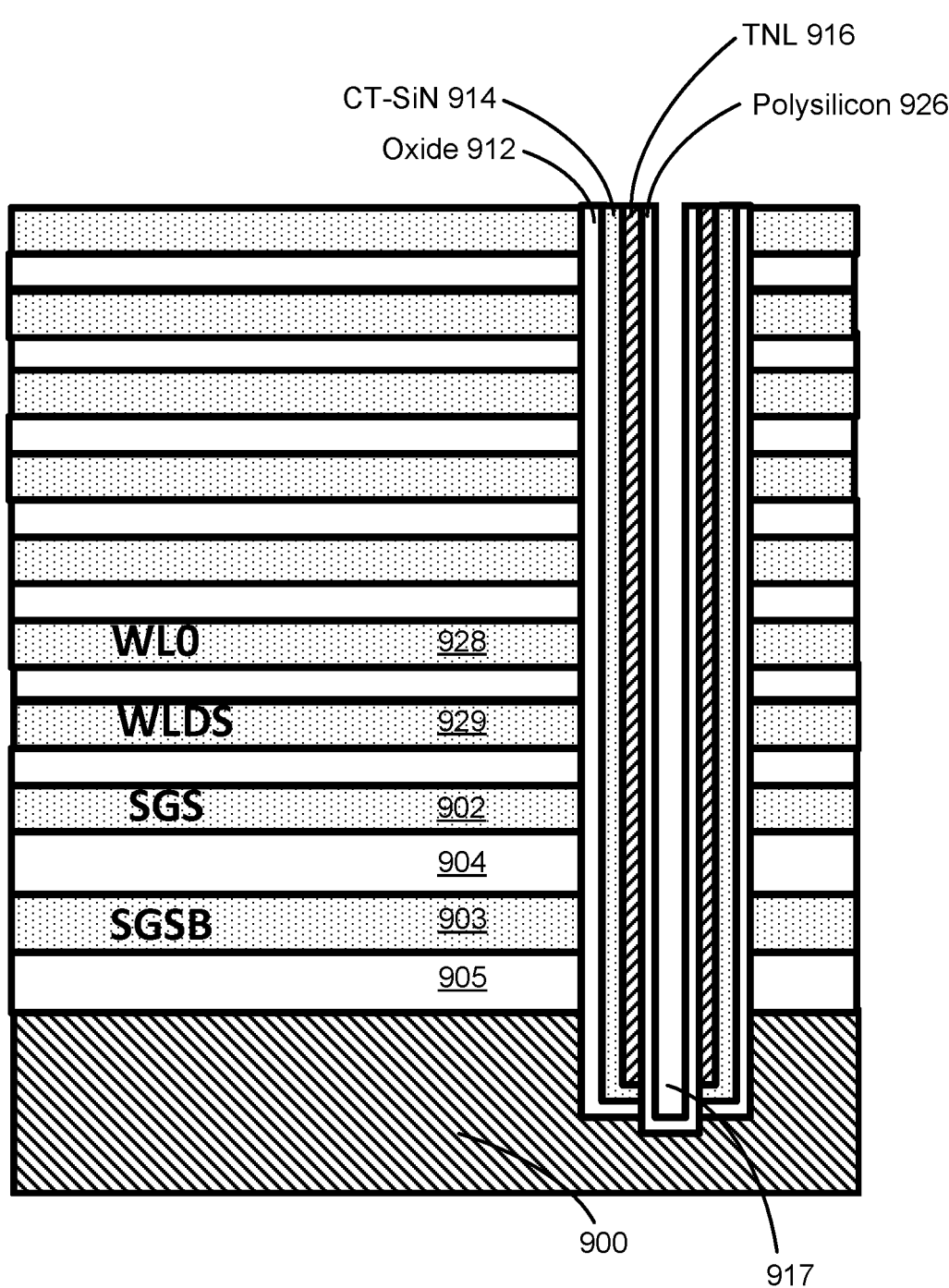
Figure 9E:
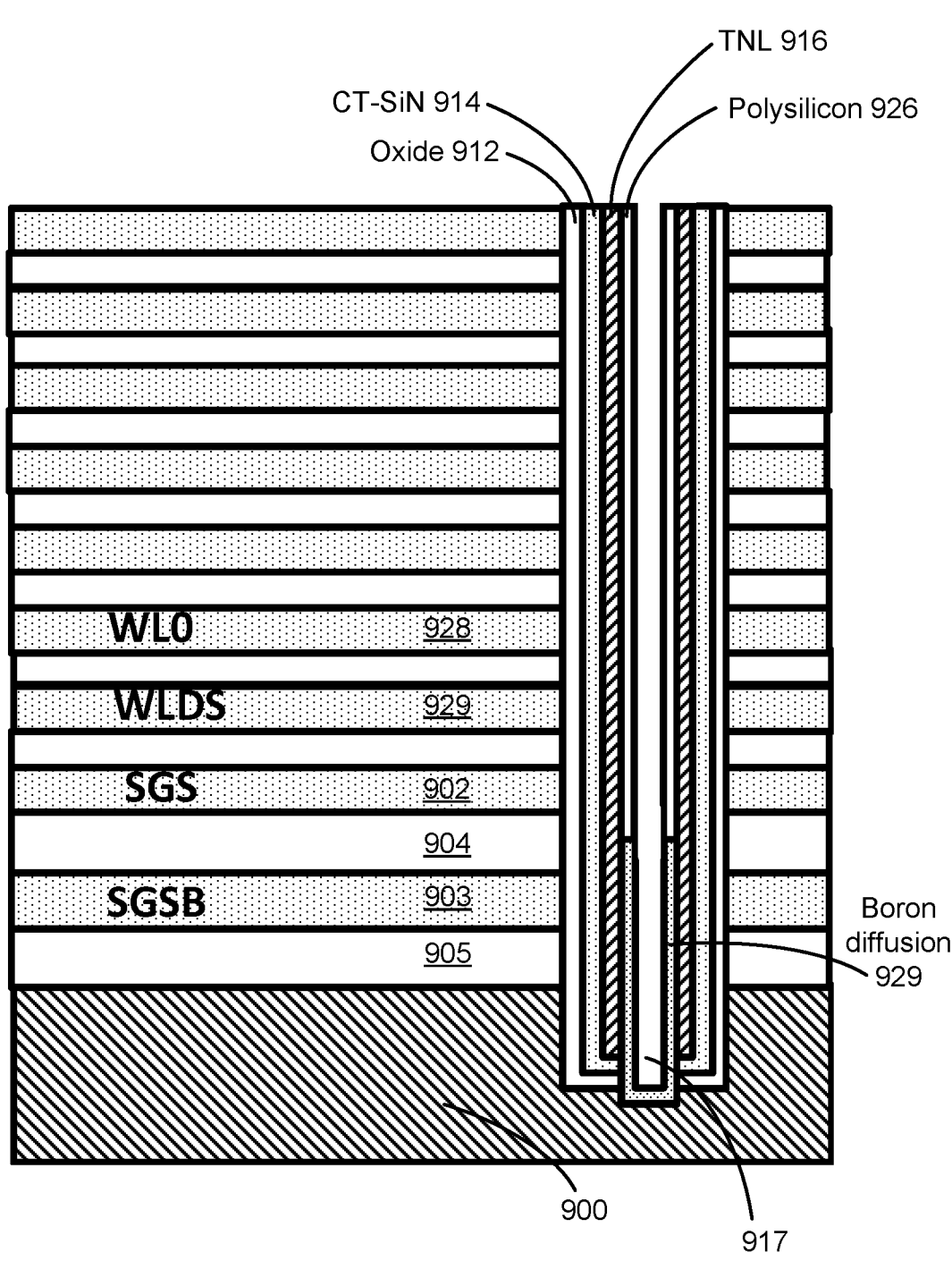
Figure 9F:
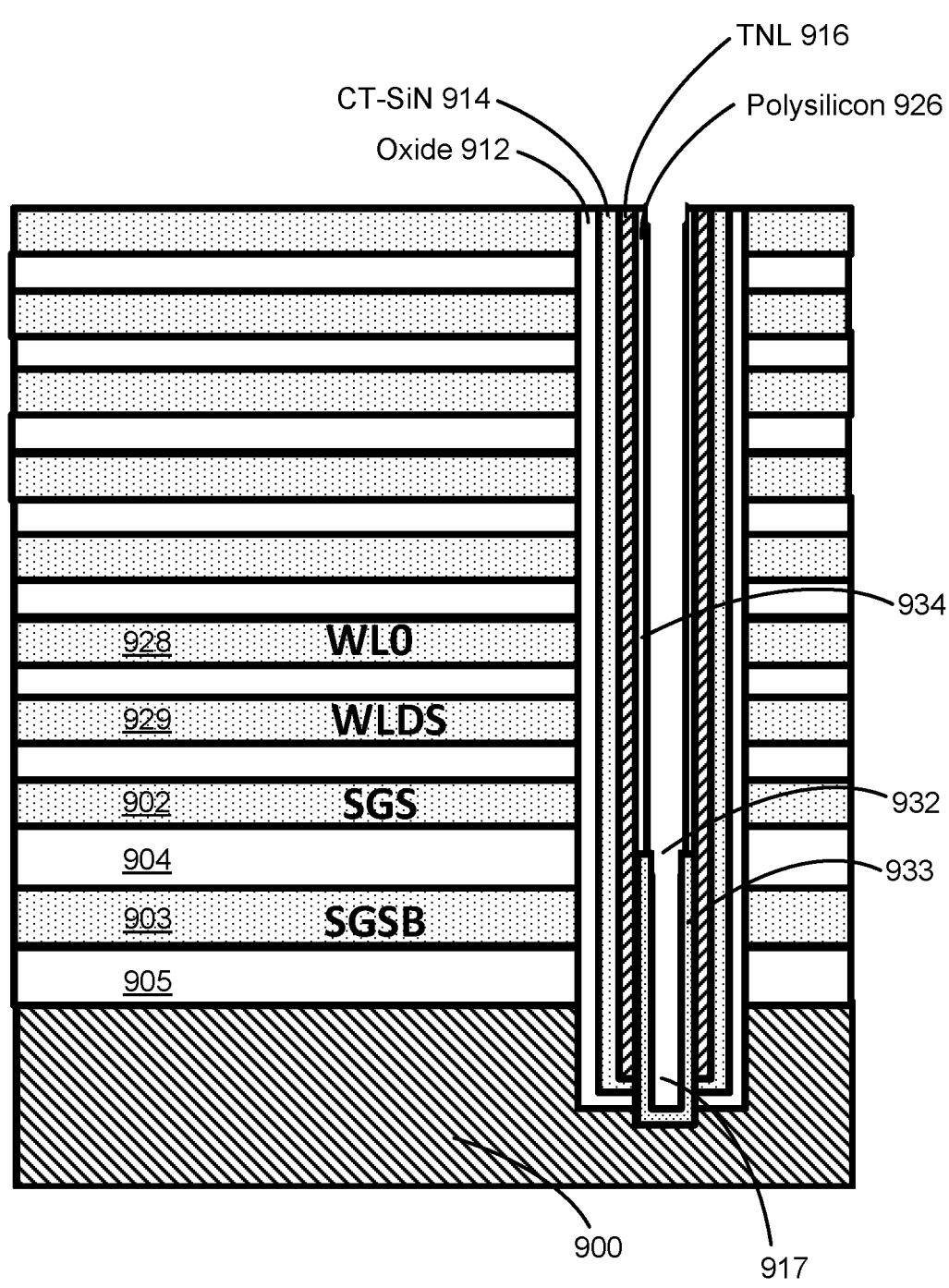
Figure 9G:
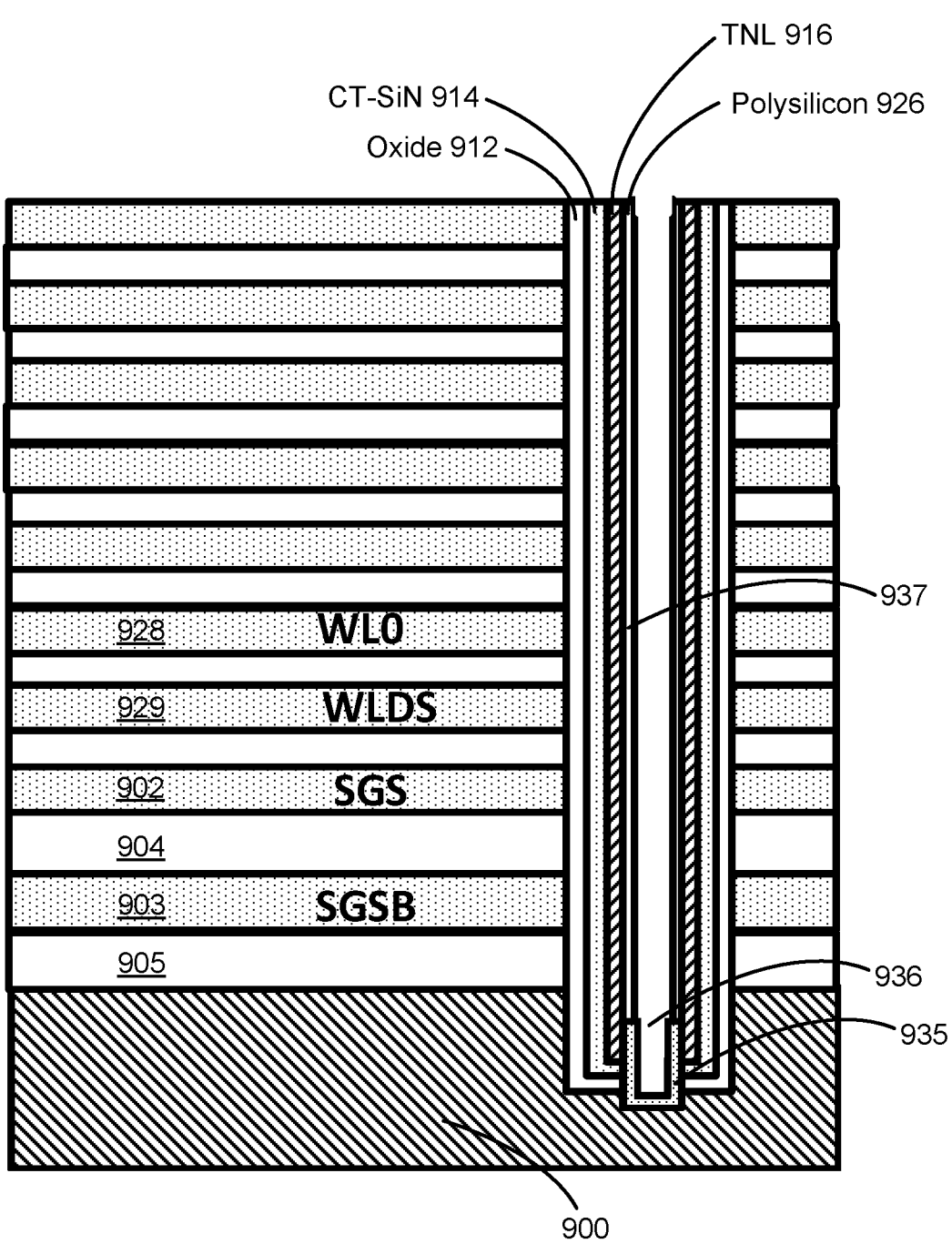
Figure 9H:
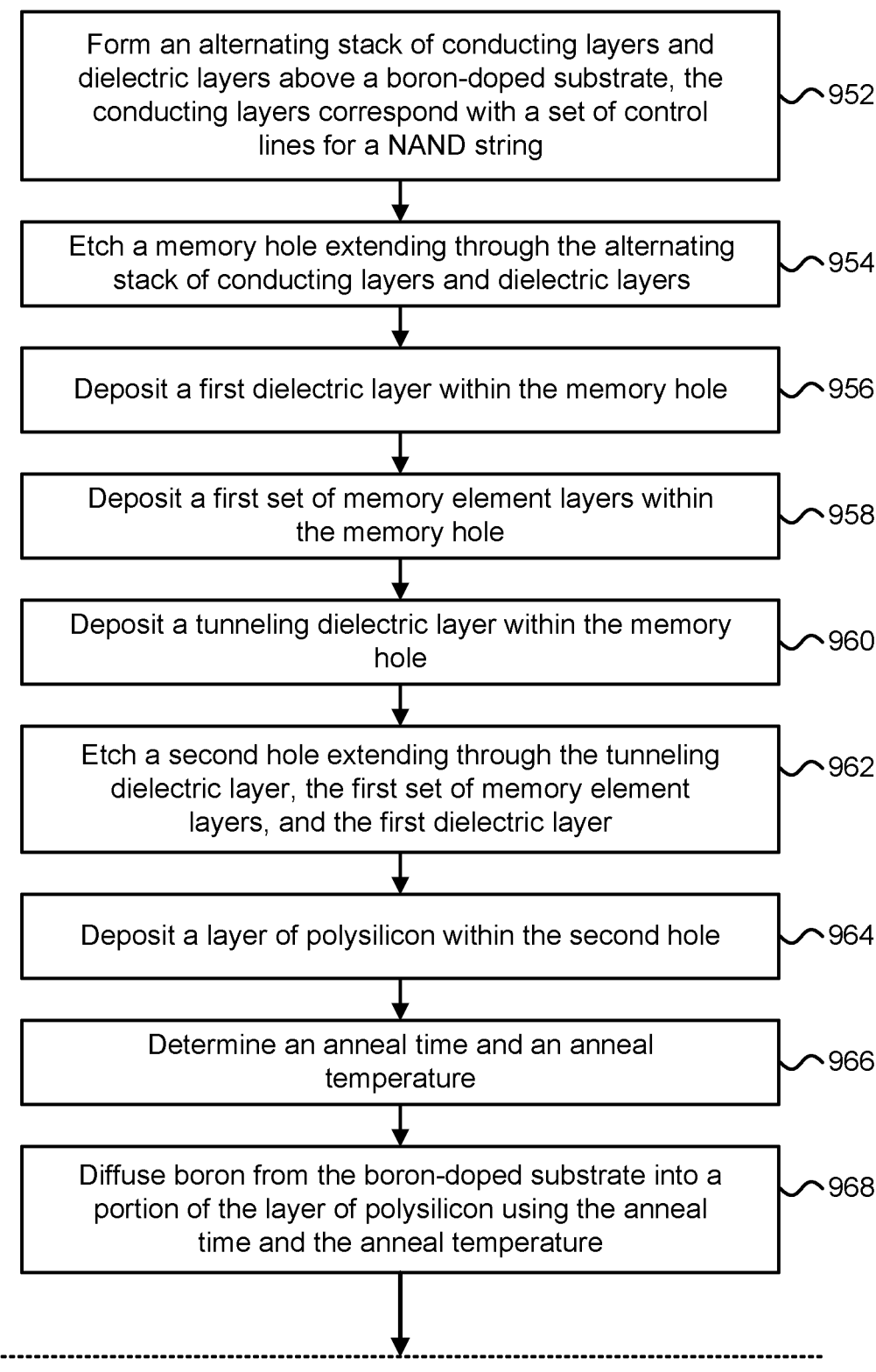
FIGS. 9H-9I depict a flowchart describing one embodiment of a process for fabricating a vertical NAND string.
Figure 9I:
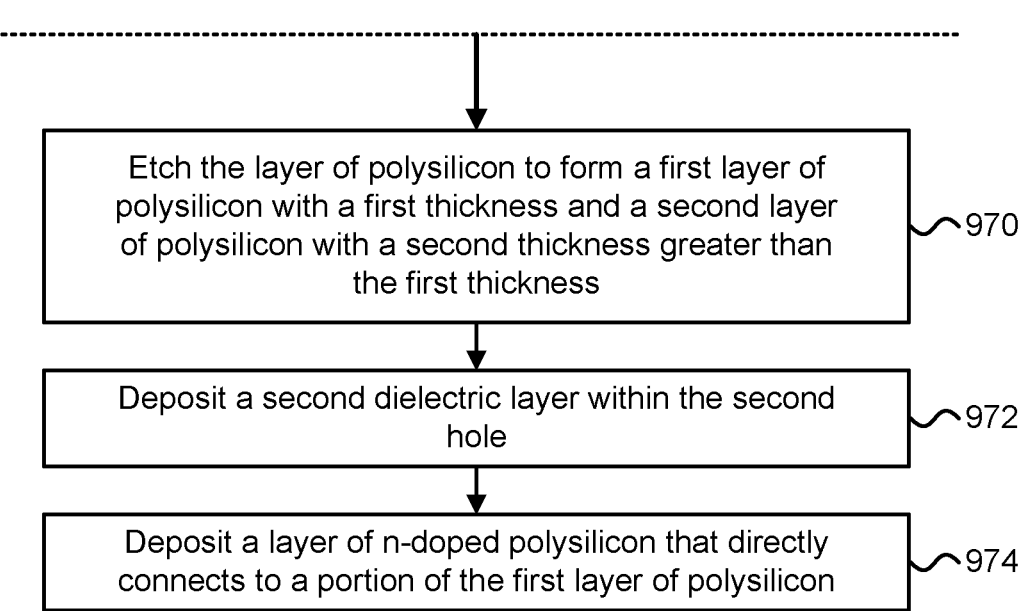
Figure 9J:
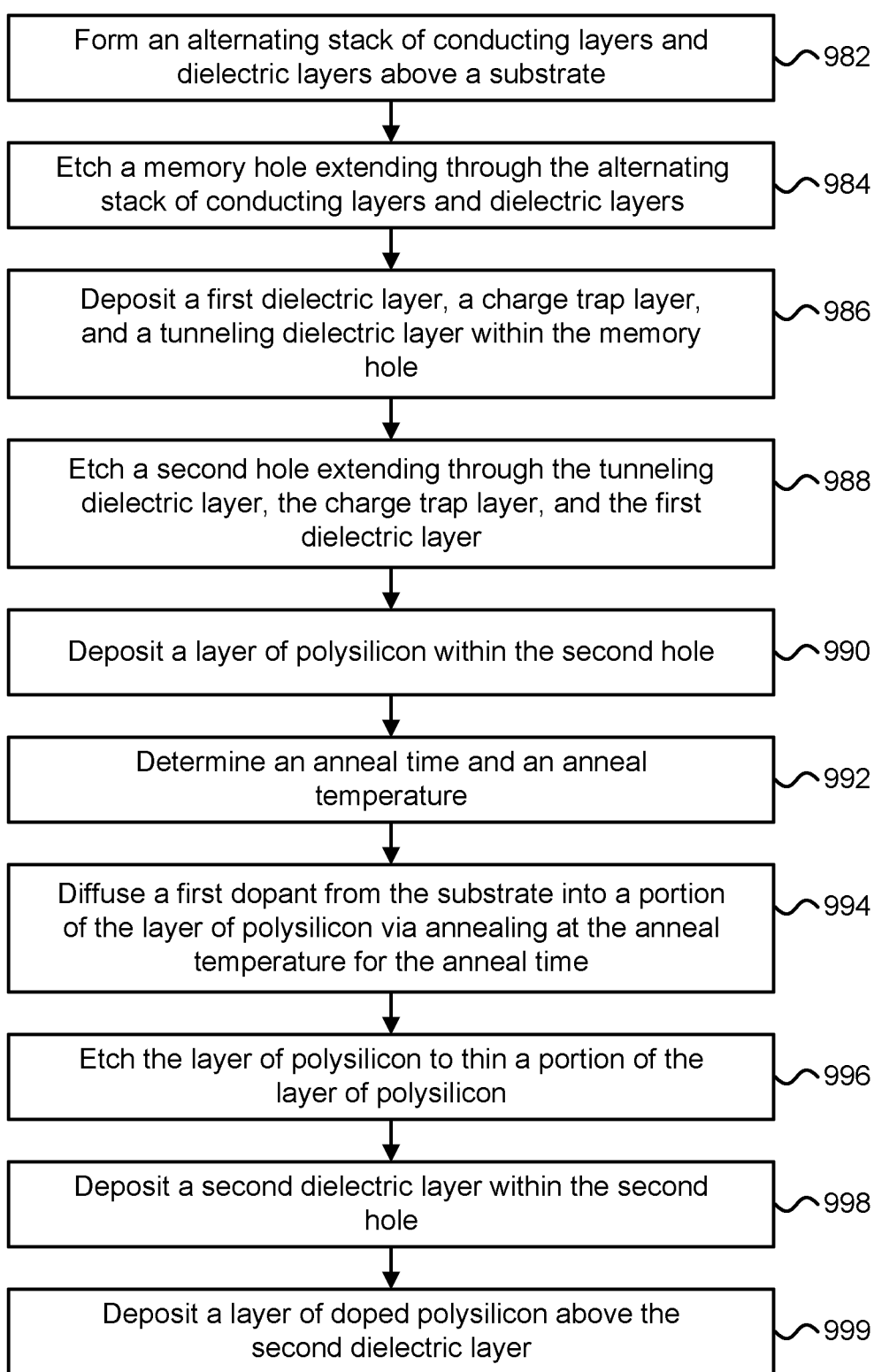
FIG. 9J depicts a flowchart describing an alternative embodiment of a process for fabricating a vertical NAND string.

FIGS. 9A-9G depict various embodiments of stages of fabrication of a vertical NAND string using cross-sectional views and may be referred to when describing the processes of FIGS. 9H-9J.

FIGS. 9H-9I depict a flowchart describing one embodiment of a process for fabricating a vertical NAND string, such as the vertical NAND string depicted in FIG. 8A. The flowcharts may omit common processing steps (e.g., the formation of isolation regions or structures, various implant and annealing steps, the formation of vias/contacts, the formation of a passivation layer, planarization, etc.) in order to highlight the processing steps described.

In step 952 of FIG. 9H, an alternating stack of conducting layers and dielectric layers are formed above a boron-doped substrate. The conducting layers may correspond with a set of control lines for a NAND string. In one example, the conducting layers may correspond with one or more word lines for controlling memory cell transistors of the NAND string and/or one or more select gate lines for controlling a source-side select gate or a drain-side select gate of the NAND string. In step 954, a memory hole is etched extending through the alternating stack of conducting layers and dielectric layers. The memory hole may extend completely through all of the conducting layers and dielectric layers and extend into a portion of a substrate or a well above which the alternating stack of conducting layers and dielectric layers were formed.

Referring to FIG. 9A, the memory hole 907 has been etched through an alternating stack of conducting layers and dielectric layers. The dielectric layers may comprise oxide layers. The conducting layers may comprise metallic layers or layers of SiN or polysilicon that are separated by oxide layers. The memory hole may be formed by patterning and then removing material using various etching techniques such as dry etching, wet chemical etching, plasma etching, or reactive-ion etching (RIE). An anisotropic etch may be used to produce cutout regions with substantially vertical sidewalls. In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist.

In some embodiments, a plurality of memory holes may be formed by etching through an alternating stack of conducting (e.g., word line layers) and dielectric layers to form the plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching.

As depicted in FIG. 9A, the conducting layers that include a first conducting layer 903 corresponding with a control line for a first source-side select gate (SGSB), a second conducting layer 902 corresponding with a control line for a second source-side select gate (SGS), a third conducting layer 929 corresponding with a control line for a dummy word line transistor (WLDS), and a fourth conducting layer 928 corresponding with the control line for a word line memory cell transistor (WL0). Between and electrically separating the conducting layers are dielectric layers including oxide layer 905 and oxide layer 904. The dielectric layers may comprise a layer of silicon dioxide. The conducting layers may comprise doped polysilicon, SiN, TiN, or tungsten (W). As depicted, the alternating stack of conducting layers and dielectric layers have been formed above a substrate 900. The substrate 900 may comprise a p-type substrate or a p-type well. In some cases, the substrate 900 may comprise a boron doped well or a boron doped source line layer.

In step 956 of FIG. 9H, a first dielectric layer is deposited within the memory hole. The first dielectric layer may comprise a layer of silicon dioxide. In step 958, a first set of memory element layers is deposited within the memory hole. The first set of memory element layers may include a charge trap layer. The first set of memory element layers may include a layer of silicon nitride. In step 960, a tunneling dielectric layer is deposited within the memory hole. The first dielectric layer, the first set of memory element layers, and/or the tunneling dielectric layer may be deposited using various deposition techniques such as chemical vapor deposition (CVD), physical vapor deposition (PVD), or atomic layer deposition (ALD). In some embodiments, the first set of memory element layers may comprise a charge trap material, a phase change material, a ferroelectric material, or a metal oxide such as nickel oxide or hafnium oxide. In some cases, the first set of memory element layers may have a thickness (or width) of 2 nm to 4 nm.

As depicted in FIG. 9B, an oxide layer 912, a charge trap layer 914 (e.g., comprising a layer of silicon nitride), and a tunneling dielectric layer 916 have been deposited within the memory hole 907 of FIG. 9A. Each of the layers 912, 914, and 916 may be conformally deposited within the memory hole 907.

In step 962 of FIG. 9H, a second hole is etched extending through the tunneling dielectric layer, the first set of memory element layers, and the first dielectric layer. As depicted in FIG. 9C, an oxide layer 912, a charge trap layer 914, and a thin dielectric layer or a tunneling dielectric layer 916 have been deposited within the memory hole 907 of FIG. 9A and a second hole 917 has been etched extending through the oxide layer 912, the charge trap layer 914, and the tunneling dielectric layer 916. The second hole 917 may extend into a portion of the substrate 900. The oxide layer 912 may comprise a layer of silicon dioxide. The charge trap layer 914 may comprise a layer of silicon nitride. The tunneling dielectric layer 916 may comprise a thin oxide layer. In some cases, the tunneling dielectric layer may comprise one or more layers. In one example, the tunneling dielectric layer may include a multi-layer dielectric film such as an ONO dielectric stack, which includes alternating layers of silicon dioxide ("O") and silicon nitride ("N").

In some embodiments, prior to etching the second hole, a cover polysilicon layer not depicted may be deposited over the tunneling dielectric layer 916 in order to protect the tunneling dielectric layer 916 from damage during the subsequent etching of the second hole. After the cover polysilicon layer has been deposited over the tunneling dielectric layer 916, the second hole may be etched (e.g., using an anisotropic etch) that extends through the cover polysilicon layer, the tunneling dielectric layer, the first set of memory element layers, and the first dielectric layer. The second hole may also extend into a portion of the substrate 900. After the second hole has been etched, the cover polysilicon layer may be removed prior to deposition of the channel polysilicon layer.

In step 964 of FIG. 9H, a layer of polysilicon is deposited within the second hole. As depicted in FIG. 9D, a layer of polysilicon 926 has been deposited within the second hole 917 of FIG. 9C.

In step 966 of FIG. 9H, an anneal time and an annual temperature are determined. The anneal time and the annual temperature may be stored within a lookup table and may be used to identify the anneal time and the anneal temperature that will cause boron within the boron-doped substrate to be diffused into the layer of polysilicon up to a particular height or up to a particular conducting layer within the NAND string. In step 968, boron is diffused from the boron-doped substrate into a portion of the layer of polysilicon by performing an anneal for the anneal time at the anneal temperature. In one example, a rapid thermal anneal or a furnace anneal may be used. In another example, the anneal temperature may comprise 400 degrees Celsius and the anneal time may comprise 45 seconds. As depicted in FIG. 9E, boron 929 has been diffused into the layer of polysilicon 926 up to a level corresponding with the oxide layer 904.

In step 970 of FIG. 9I, the layer of polysilicon is etched to form a first layer of polysilicon with a first thickness and a second layer of polysilicon with a second thickness greater than the first thickness. In one example, the first thickness may comprise 4 nm and the second thickness may comprise 10 nm. In step 972, a second dielectric layer is deposited within the second hole. In some embodiments, the second dielectric layer may comprise a layer of silicon dioxide that is deposited using various deposition techniques such as chemical vapor deposition (CVD), physical vapor deposition (PVD), or atomic layer deposition (ALD). The second dielectric layer may completely fill the second hole. In step 974, a layer of n-doped polysilicon is deposited and directly connects to a portion of the first layer of polysilicon. The layer of n-doped polysilicon may correspond with a bit line contact to the drain-side end of the NAND string.

As depicted in FIG. 9F, the layer of polysilicon 926 has been etched to form a thicker portion 933 of the layer of polysilicon and a thinner portion 934 of the layer of polysilicon. The interface 932 between the thinner portion 934 of the layer of polysilicon and the thicker portion 933 of the layer of polysilicon is positioned above the source-side select gate that is controlled by the source-side select gate line SGSB corresponding with the conducting layer 903. In this case, the source-side select transistor controlled by the source-side select gate line SGSB has a thicker gate oxide compared with the source-side select transistor controlled by the source-side select gate line SGS or any of the memory cell transistors within the NAND string.

As depicted in FIG. 9G, the layer of polysilicon 926 has been etched to form a thicker portion 935 of the layer of polysilicon and a thinner portion 937 of the layer of polysilicon. The interface 936 between the thinner portion 937 of the layer of polysilicon and the thicker portion 935 of the layer of polysilicon is positioned below the source-side select gate that is controlled by the source-side select gate line SGSB corresponding with the conducting layer 903 and is positioned below the oxide layer 905 that abuts and was formed above the substrate 900. The thicker portion 935 of the layer of polysilicon is positioned near the source-side end of the NAND string to prevent overthinning of the layer of polysilicon where the layer of polysilicon connects to the substrate 900.

In one embodiment, the thicker portion of the layer of polysilicon may be formed for one or more source-side select gate transistors of the NAND string while the thinner portion of the layer of polysilicon may be formed for the memory cell transistors and one or more drain-side select gate transistors of the NAND string. In another embodiment, the thinner portion of the layer of polysilicon may be formed for one or more source-side select gate transistors, the memory cell transistors, and one or more drain-side select gate transistors of the NAND string while the thicker portion of the layer of polysilicon may be formed between the one or more source-side select gate transistors and the source line connection to the NAND string.

FIG. 9J depicts a flowchart describing an alternative embodiment of a process for fabricating a vertical NAND string, such as the vertical NAND string depicted in FIG. 8A. The flowchart may omit common processing steps (e.g., the formation of isolation regions or structures, various implant and annealing steps, the formation of vias/contacts, the formation of a passivation layer, planarization, etc.) in order to highlight the processing steps described.

In step 982, an alternating stack of conducting layers and dielectric layers is formed above a substrate. The conducting layers may correspond with a set of control lines for a NAND string. For example, the conducting layers may correspond with one or more word lines for controlling memory cell transistors of the NAND string and/or one or more select gate lines for controlling a source-side select gate or a drain-side select gate of the NAND string. In step

984, a memory hole is etched extending through the alternating stack of conducting layers and dielectric layers.

Referring to FIG. 9A, a memory hole 907 has been etched extending through conducting layers that include a first conducting layer 903 corresponding with a control line for a first source-side select gate (SGSB), a second conducting layer 902 corresponding with a control line for a second source-side select gate (SGS), a third conducting layer 929 corresponding with a control line for a dummy word line transistor (WLDS), and a fourth conducting layer 928 corresponding with the control line for a word line memory cell transistor (WL0). Between the conducting layers are dielectric layers including oxide layer 905 and oxide layer 904.

In step 986, a first dielectric layer, a charge trap layer, and a tunneling dielectric layer are deposited within the memory hole. The first dielectric layer, a charge trap layer, and the tunneling dielectric layer may be conformally deposited within the memory hole. As depicted in FIG. 9B, an oxide layer 912, a charge trap layer 914, and a tunneling dielectric layer 916 have been deposited within the memory hole 907 of FIG. 9A. In step 988, a second hole is etched extending through the tunneling dielectric layer, the charge trap layer, and the first dielectric layer. As depicted in FIG. 9C, a second hole 917 has been etched extending through the oxide layer 912, the charge trap layer 914, and the tunneling dielectric layer 916. The second hole 917 may extend into a portion of the substrate 900.

In step 990, a layer of polysilicon is deposited within the second hole. In step 992, an anneal time and an anneal temperature are determined. In step 994, a first dopant is diffused from the substrate into a portion of the layer of polysilicon via annealing at the anneal temperature for the anneal time. The first dopant may comprise boron. As depicted in FIG. 9E, boron 929 has been diffused into the layer of polysilicon 926 up to a level corresponding with the oxide layer 904 via an annealing step.

In step 996, the layer of polysilicon is etched to thin only a portion of the layer of polysilicon. As depicted in FIG. 9F, the layer of polysilicon 926 has been etched to form a thicker portion 933 of the layer of polysilicon and a thinner portion 934 of the layer of polysilicon. The interface 932 between the thinner portion 934 of the layer of polysilicon and the thicker portion 933 of the layer of polysilicon is positioned above the substrate 900 and below any of the conducting layers associated with word lines for the NAND string. In step 998, a second dielectric layer is deposited within the second hole. In step 999, a layer of doped polysilicon (e.g., heavily doped n-type polysilicon) is deposited above the second dielectric layer. The second dielectric layer may fill the second hole and the layer of doped polysilicon may correspond with a bit line contact to the NAND string.

One embodiment of the disclosed technology includes forming an alternating stack of conducting layers and dielectric layers above a substrate, etching a memory hole extending through the alternating stack of conducting layers and dielectric layers, depositing a first dielectric layer within the memory hole, depositing one or more memory element layers within the memory hole, depositing a tunneling dielectric layer within the memory hole, and etching a second hole extending through the tunneling dielectric layer, the one or more memory element layers, and the first dielectric layer. The method further comprises depositing a layer of polysilicon within the second hole, diffusing a first dopant from the substrate into a second portion of the layer of polysilicon, and etching the layer of polysilicon to form a first portion of the layer of polysilicon with a first thickness and the second portion of the layer of polysilicon with a second thickness greater than the first thickness.

One embodiment of the disclosed technology includes etching a memory hole through an alternating stack of conducting layers and dielectric layers, depositing a first dielectric layer, a charge trap layer, and a tunneling dielectric layer within the memory hole, and etching a second hole through the tunneling dielectric layer, the charge trap layer, and the first dielectric layer. The method further comprises depositing a layer of polysilicon within the second hole, diffusing a first dopant into a second portion of the layer of polysilicon, and etching the layer of polysilicon to thin a first portion of the layer of polysilicon at a faster etch rate then the second portion of the layer of polysilicon. The first portion of the layer of polysilicon is etched to a first thickness and the second portion of the layer of polysilicon is etched to a second thickness that is greater than the first thickness.

One embodiment of the disclosed technology includes an alternating stack of conducting layers and dielectric layers, a charge trap layer, a layer of polysilicon, and a tunneling dielectric layer arranged between the charge trap layer and the layer of polysilicon. The charge trap layer extends through the alternating stack of conducting layers and dielectric layers. The layer of polysilicon comprises a first portion of the layer of polysilicon with a first thickness and a second portion of the layer of polysilicon with a second thickness that is greater than the first thickness. The second portion of the layer of polysilicon is arranged below the alternating stack of conducting layers and dielectric layers.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A non-volatile memory device comprising:
an alternating stack of conducting layers and dielectric layers;

a vertically-oriented memory hole extending through the alternating stack of conducting layers and dielectric layers;

a set of memory element layers in the memory hole;

a second hole extending through the memory element layers; and a layer of polysilicon disposed on sidewalls of the second hole, wherein the layer of polysilicon comprises a first portion having a first thickness and a second portion having a second thickness that is greater than the first thickness, the second portion disposed below the first portion.

2. The non-volatile memory device of claim 1, wherein:

the first portion comprises undoped polysilicon; and the second portion comprises boron-doped polysilicon.

3. The non-volatile memory device of claim 1, further comprising a boron-doped substrate disposed below the alternating stack of conducting layers and dielectric layers.

4. A non-volatile memory device comprising:

a memory hole extending through an alternating stack of conducting layers and dielectric layers;

a first dielectric layer, a charge trap layer, and a tunneling dielectric layer disposed within the memory hole;

a second hole extending through the tunneling dielectric layer, the charge trap layer, and the first dielectric layer; and a layer of polysilicon disposed within the second hole, wherein the layer of polysilicon comprises a first portion having a first thickness, and a second portion having a second thickness that is greater than the first thickness, the second portion comprising a first dopant.

5. The non-volatile memory device of claim 4, wherein the first dopant comprises boron.

6. The non-volatile memory device of claim 4, further comprising a substrate disposed below the alternating stack of conducting layers and dielectric layers.

7. The non-volatile memory device of claim 4, wherein:

the charge trap layer includes a layer of silicon nitride; and the memory hole comprises a vertical cylindrical hole.

8. The non-volatile memory device of claim 4, further comprising:

a second dielectric layer within the second hole; and a layer of n-doped polysilicon disposed above the second dielectric layer that directly connects to the first portion.

9. The non-volatile memory device of claim 4, further comprising a memory element layer within the memory hole.

10. The non-volatile memory device of claim 9, wherein:

the substrate comprises a boron-doped substrate; and the second portion of the layer of polysilicon does not extend above a surface of the substrate.

* * * * *